United States Patent
Cheng et al.

(10) Patent No.: US 10,083,986 B2
(45) Date of Patent: Sep. 25, 2018

(54) CMOS WITH MIDDLE OF LINE PROCESSING OF III-V MATERIAL ON MANDREL

(71) Applicant: International Business Machines Corporation, Armonk, NY (US)

(72) Inventors: Cheng-Wei Cheng, White Plains, NY (US); Sanghoon Lee, Yorktown Heights, NY (US); Effendi Leobandung, Stormville, NY (US); Renee T. Mo, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/429,461

(22) Filed: Feb. 10, 2017

(65) Prior Publication Data
US 2018/0233516 A1 Aug. 16, 2018

(51) Int. Cl.
| | |
|---|---|
| H01L 21/00 | (2006.01) |
| H01L 27/12 | (2006.01) |
| H01L 29/66 | (2006.01) |
| H01L 21/8234 | (2006.01) |
| H01L 21/324 | (2006.01) |
| H01L 21/84 | (2006.01) |

(Continued)

(52) U.S. Cl.
CPC ........ *H01L 27/1211* (2013.01); *H01L 21/324* (2013.01); *H01L 21/823437* (2013.01); *H01L 21/823468* (2013.01); *H01L 21/823821* (2013.01); *H01L 21/823828* (2013.01); *H01L 21/823864* (2013.01); *H01L 21/845* (2013.01); *H01L 27/0924* (2013.01); *H01L 29/66545* (2013.01)

(58) Field of Classification Search
CPC ............. H01L 27/1211; H01L 27/0924; H01L 29/66454
See application file for complete search history.

(56) References Cited

U.S. PATENT DOCUMENTS 8,653,599 B1 * 2/2014 Cheng .................. H01L 21/845
257/351
2007/0132038 A1 * 6/2007 Chong ............ H01L 21/823807
257/401

(Continued)

*Primary Examiner* — Nicholas Tobergte
(74) *Attorney, Agent, or Firm* — Harrington & Smith; Louis J. Percello

(57) ABSTRACT

A method includes forming first structures on a first portion of a silicon substrate and second structures on a second portion of the substrate; forming spacers on the first structures; forming dummy gates on the first and second structures; depositing a first interlayer dielectric on the dummy gates; removing the dummy gates from the second structures; forming metal gates on the second structures; performing an anneal; forming recess areas in the first interlayer dielectric; removing the spacers from the first structures; epitaxially growing sidewalls on the first structures; removing portions of the first structures outside the dummy gates from the first portion; depositing a second interlayer dielectric on the first portion; removing the dummy gates from the first portion; removing portions of the first structures previously under the dummy gates from the first portion; and forming metal gates on the first structures.

9 Claims, 30 Drawing Sheets

(51) Int. Cl.
*H01L 21/8238* (2006.01)
*H01L 27/092* (2006.01)

(56) References Cited

U.S. PATENT DOCUMENTS

2009/0283838 A1* 11/2009 Park ............... H01L 21/823842
                                                             257/369
2010/0207176 A1*  8/2010 Hargrove .......... H01L 21/28079
                                                             257/288

* cited by examiner

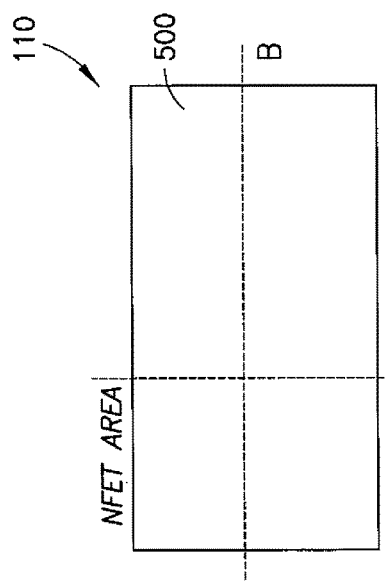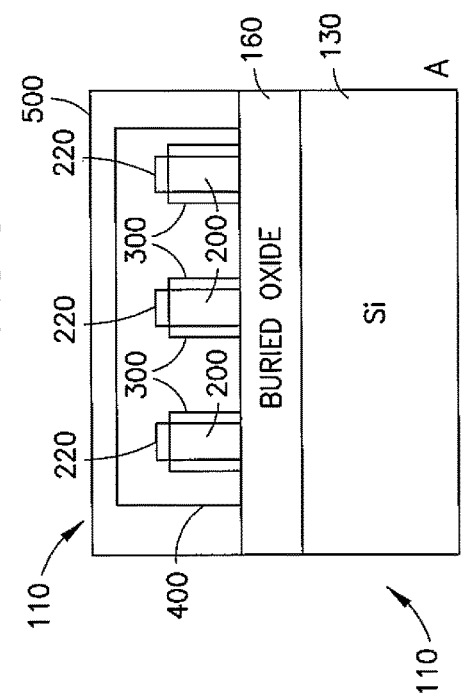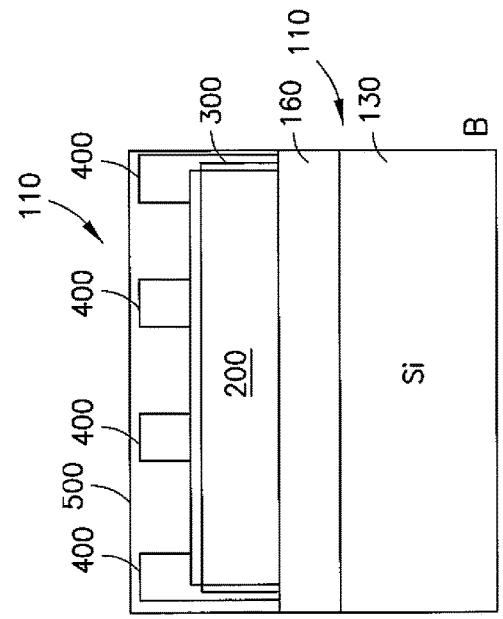

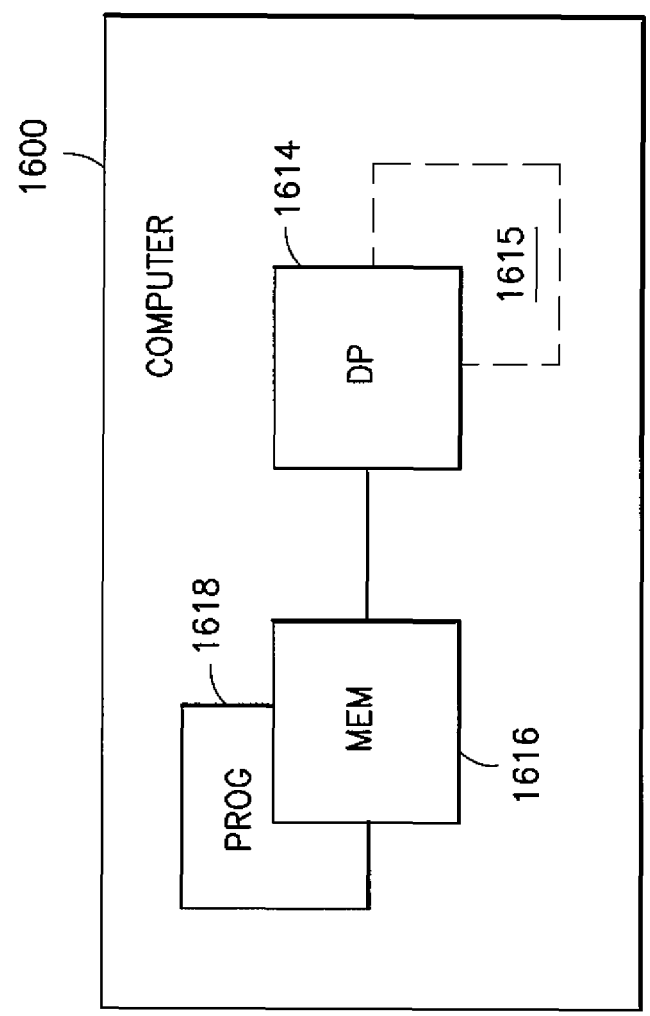

CMOS WITH MIDDLE OF LINE PROCESSING OF III-V MATERIAL ON MANDREL

BACKGROUND

The exemplary embodiments of this invention relate generally to semiconductor devices and techniques for the fabrication thereof and, more specifically, to the fabrication of complementary metal oxide semiconductor (CMOS) devices processed with III-V materials.

A complementary metal oxide semiconductor device (CMOS) uses pairs of p-type and n-type metal oxide semiconductor field effect transistors (MOSFETs) arranged on silicon or silicon-on-insulator (SOI) substrates. A MOSFET, which is used for amplifying or switching electronic signals for logic functions, has source and drain regions connected by a channel. The source region is a terminal through which current in the form of majority charge carriers enters the channel, and the drain region is a terminal through which current in the form of majority charge carriers leaves the channel. In a p-type MOSFET (hereinafter "PFET"), the majority charge carriers are holes that flow through the channel, and in an n-type MOSFET (hereinafter "NFET"), the majority charge carriers are electrons that flow through the channel. The channel may be defined by an element such as one or more fins, one or more nanowires, or one or more sheets, such fins, nanowires, or sheets including silicon. One or more gates are positioned over or around the channel to control the flow of current between the source and drain regions.

The channels may be fabricated of, for example, germanium or III-V materials. In forming channels, III-V materials have previously been grown on mandrels (or after the formation of any dummy gates but before the formation of replacement metal gates (RMG)). However, processing of PFETs generally involves high temperatures, which may be unsuitable with regard to III-V materials. In particular, PFET processing typically involves a high-k reliability anneal, and since the temperatures at which such an anneal is carried out may be incompatible with any III-V materials utilized, at least some PFET processes have avoided the anneal. Furthermore, prior processes have utilized two III-V sidewall growths that result in colliding growth fronts, which has generally resulted in lattice mismatch along the interface of the two growths, thereby contributing to decreased PFET performance.

BRIEF SUMMARY

In accordance with one aspect of an exemplary embodiment, a method comprises forming first structures on a first portion of a silicon substrate and second structures on a second portion of the silicon substrate; forming spacers on the first structures; forming dummy gates on the first structures and on the second structures; depositing a first interlayer dielectric on the formed dummy gates in the first portion and the second portion; removing the dummy gates from the second structures; forming one or more second metal gates on the second structures; performing an anneal on the silicon substrate, the first structures, and the second structures; forming recess areas in the first interlayer dielectric to expose the first structures; removing the spacers from the first structures; epitaxially growing sidewalls on the first structures; removing portions of the first structures outside the dummy gates from the first portion; depositing a second interlayer dielectric on the first portion; removing the dummy gates from the first portion; removing portions of the first structures previously under the dummy gates from the first portion; and forming one or more first metal gates on the first structures.

In accordance with another aspect of an exemplary embodiment, a method comprises providing a silicon substrate, a buried oxide layer on the silicon substrate, an NFET layer of silicon-on-insulator on an NFET portion of the buried oxide layer, and a PFET layer of silicon-on-insulator or SiGe on a PFET portion of the buried oxide layer; forming mandrels in the silicon-on-insulator of the NFET layer; forming fins in the silicon-on-insulator or SiGe of the PFET layer; forming first spacers on the mandrels; forming dummy gates on the mandrels and on the fins; depositing a first interlayer dielectric on the formed dummy gates in the NFET portion and the PFET portion; removing the dummy gates from the fins; forming one or more metal gates on the fins; performing an anneal on the silicon substrate, the mandrels, and the fins; forming recess areas in the first interlayer dielectric to expose the mandrels; removing the first spacers; epitaxially growing sidewalls on the mandrels; removing portions of the mandrels outside the dummy gates from the NFET portion; depositing a second interlayer dielectric on the NFET portion; removing the dummy gates from the NFET portion; removing remaining portions of the mandrels from the NFET portion to leave the sidewalls grown on the mandrels; and forming one or more metal gates on the sidewalls grown on the removed mandrels.

In accordance with another aspect of an exemplary embodiment, a structure comprises a substrate having a handle layer of silicon, a buried oxide layer on the handle layer, an NFET layer of silicon-on-insulator on an NFET portion of the buried oxide layer, and a PFET layer of silicon-on-insulator or SiGe on a PFET portion of the buried oxide layer; fins in the silicon-on-insulator or SiGe of the PFET layer; source/drains in the PFET layer; one or more first metal gates on the fins; channel structures of III-V material in the silicon-on-insulator in the NFET portion; source/drains in the NFET portion; and one or more second metal gates on the channel structures in the NFET layer.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein:

FIGS. 5A through 5D are schematic representations of an interlayer dielectric disposed on the dummy gates;

FIG. 16 is a block diagram of various electronic devices and apparatuses that may be suitable for use in forming the structures described herein.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided. to enable persons skilled in the art to make or use the invention and not to limit the scope of the invention which is defined by the claims.

As used herein, the term "III-V" refers to inorganic crystalline compound semiconductors having at least one Group III element and at least one Group V element. Exemplary III-V materials for use in the structures and methods described herein include, but are not limited to, gallium arsenide (GaAs), aluminum arsenide (AlAs), gallium phosphide (GaP), gallium nitride (GaN), gallium arsenide phosphide (GaAsP), gallium indium arsenide antimony phosphide (GaInAsSbP), aluminum gallium arsenide (AlGaAs), aluminum gallium indium arsenide (AlGaInAs), indium arsenide (InAs), indium gallium phosphide (InGaP), indium gallium arsenide (InGaAs), indium arsenide antimony phosphide (InAsSbP), indium gallium aluminum phosphide (InGaAlP), and combinations of the foregoing.

As shown in FIGS. 1-17, examples of methods of fabricating a CMOS as a finFET or a fin-type device having one or more fins comprising III-V materials are shown. Such methods generally employ middle of line (MOL) processing of the III-V material on a mandrel on an NFET portion after fabrication of a replacement metal gate (RMG) and deposition of any MOL dielectric materials on a PFET portion. Furthermore, in order to minimize the opportunity for any formation of colliding growth fronts, the exemplary embodiments of the methods disclosed herein utilize one III-V material for a channel and one III-V material for n+ source/drain cladding.

Figure 1:
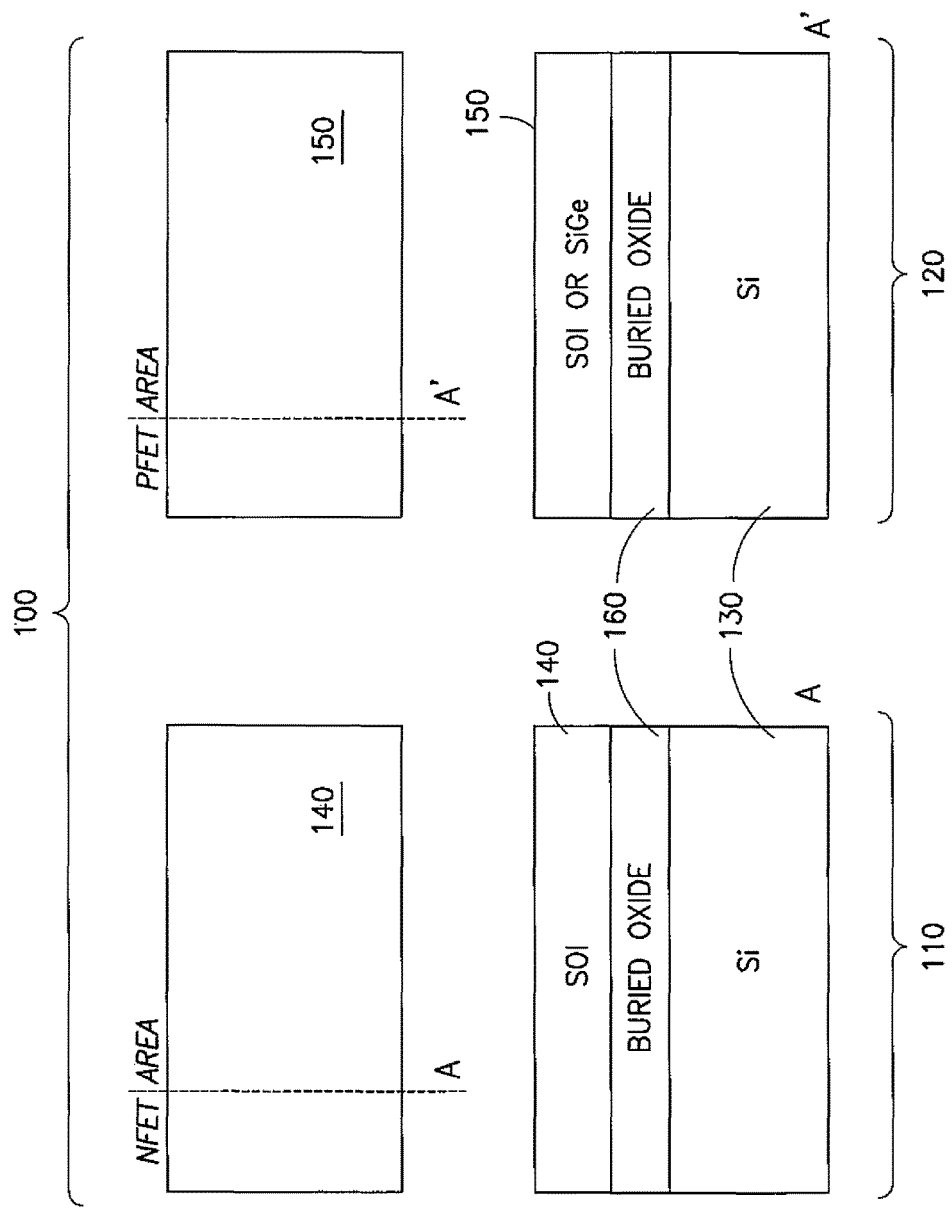
FIG. 1 is a schematic representation of a substrate having NFET and PFET areas.

As shown in FIG. 1, a substrate having an NFET area 110 and a PFET area 120 is shown generally at 100. A handle or bottom layer 130 of the substrate 100 comprises silicon. An NFET upper layer 140 comprising silicon-on-insulator (SOI) is deposited on the bottom layer 130 in the NFET area 110, and a PFET upper layer 150 comprising SOI or silicon-germanium (SiGe) is deposited on the bottom layer 130 in the PFET area 120. A buried oxide layer 160 (BOX layer 160) is formed under the NFET upper layer 140 and under the PFET upper layer 150, for example, by implantation of oxide ions, or bonding process. The BOX layer 160 may be about 150-nanometers (nm) thick, and the NFET upper layer 140 and the PFET upper layer 150 may be about 40 nm thick. Generally, the exemplary methods described herein begin with the substrate 100 as SOI; however, the exemplary methods described herein may be initiated with bulk wafer.

Figure 2:
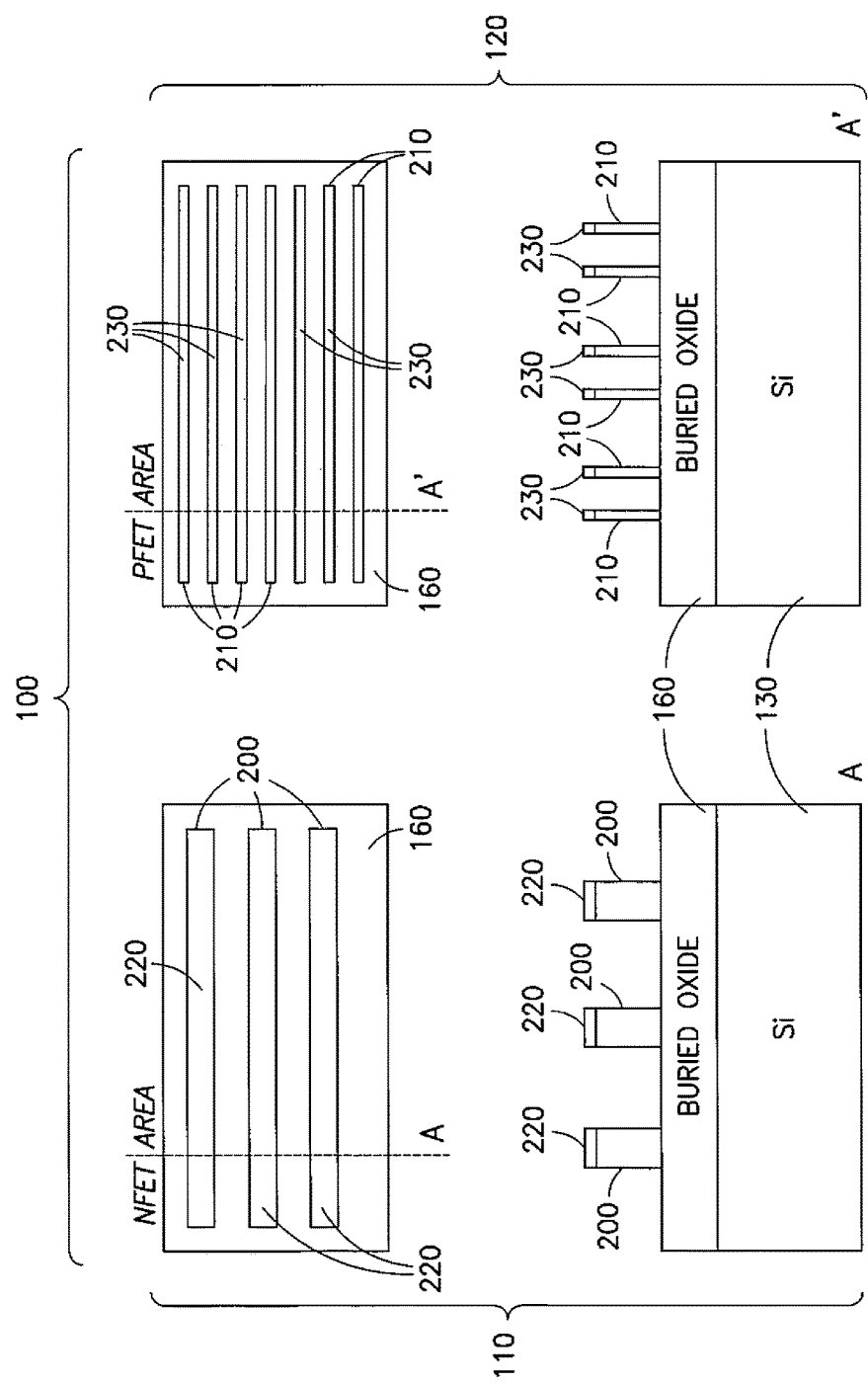
FIG. 2 is a schematic representation of the NFET and PFET areas of Figure. 1 on which mandrels and fins are formed.

Referring now to FIG. 2, after deposition of the NFET upper layer 140 and the PFET upper layer 150, the NFET area 110 is patterned using an oxide hardmask, and the PFET area 120 is patterned using any suitable technique, such as a sidewall image transfer (SIT) technique. The patterning of each area 110, 120 may be separate or together, as desired. Once patterned, any suitable wet-etching or dry-etching process may be carried out to form structures in the NFET upper layer 140 and the PFET upper layer 150. Such structures may be one or more mandrels 200 in the NFET area 110 and one or more fins 210 in the PFET area 120. Layers of the oxide hardmask 220 remain on the mandrels 200. Layers of a mask 230 used in the patterning of the PFET area 120 (e.g., by the SIT technique) remain on the fins 210.

Figure 3:
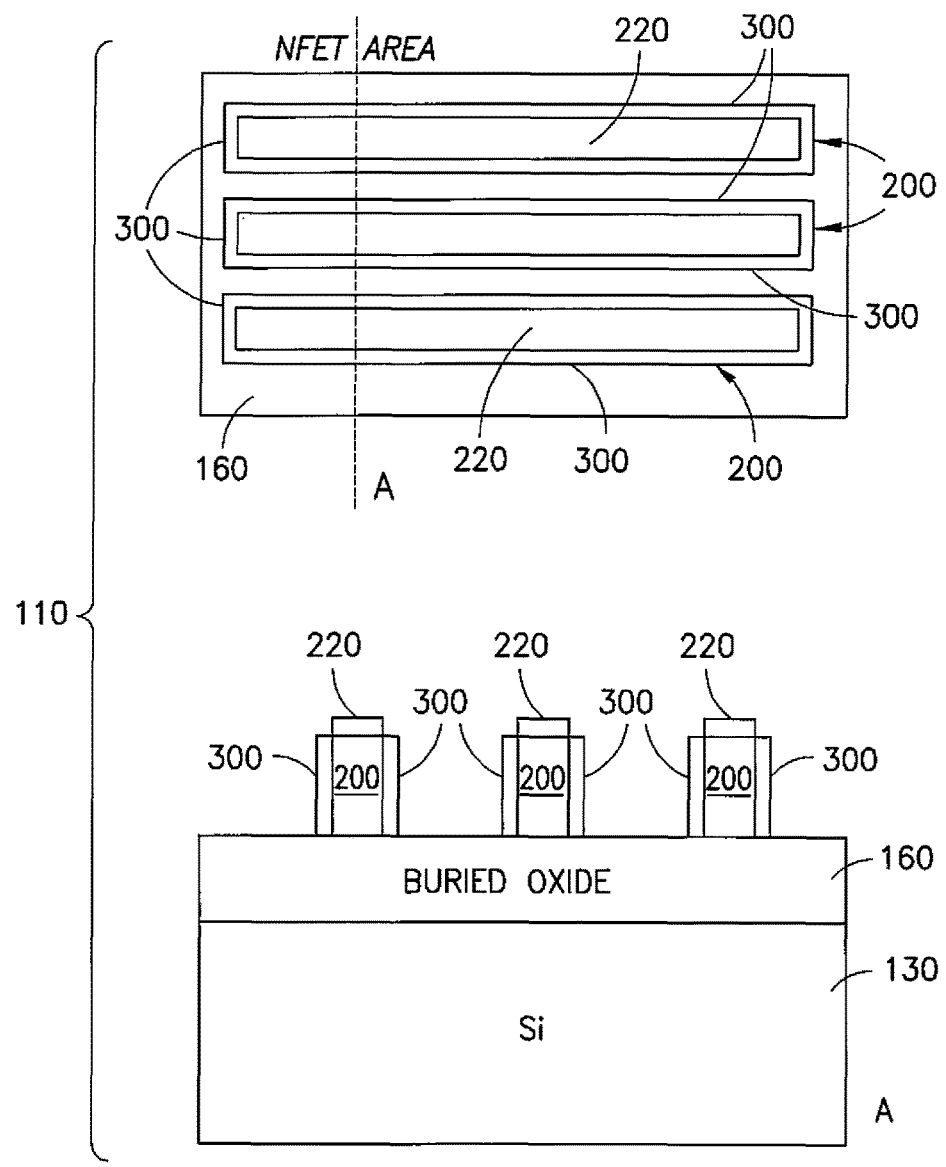
FIG. 3 is a schematic representation of the NFET area showing spacers on the mandrels.

Referring now to FIG. 3, spacers 300 are formed on sidewalks of the mandrels 200 in the NFET area 110 (and in the PFET area 120) using SIT techniques. To do so, thin layers of conformal nitride (e.g., a silicon nitride ($SiN_x$) such as, for example, SiN, $Si_3N_4$, or the like) or an oxide (e.g., $SiO_2$ or $Al_2O_3$) are deposited on the sides and ends of the mandrels 200 and the fins 210. Masking may be applied to the NFET area 110 using an oxide hardmask, and the conformal nitride or oxide is removed from the PFET area 120 using, for example, one or more of a lithography technique, stripping, a nitride wet etch, an oxide etch, an oxide strip, or the like. The remaining conformal nitride or oxide on the mandrels 200 in the NFET area 110 may be etched into a structure defining the spacer 300 using, for example, reactive ion etching (RIE) or the like.

Figure 4A:
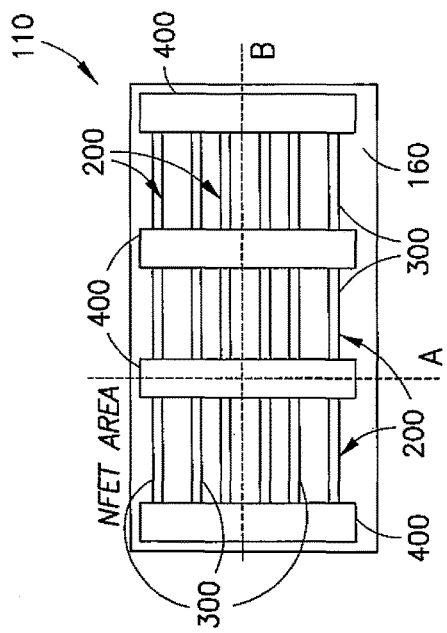
FIGS. 4A through 4D are schematic representations of dummy gates formed on the mandrels and fins.
Figure 4C:
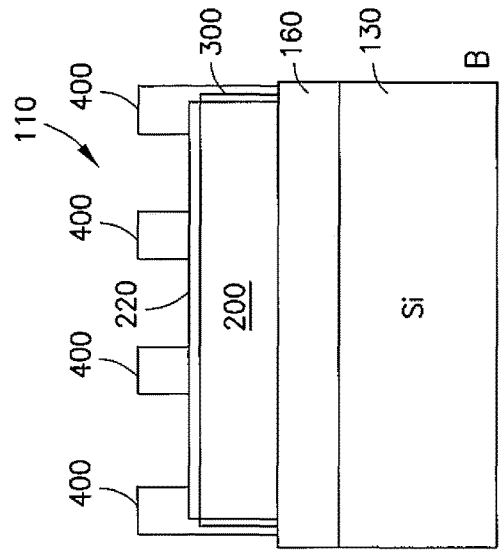
Figure 4B:
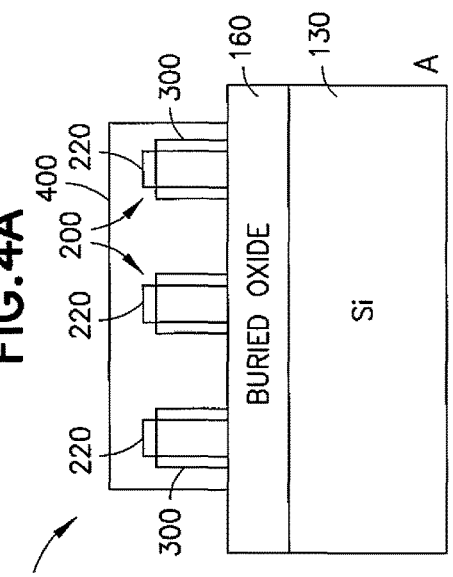
Figure 4D:
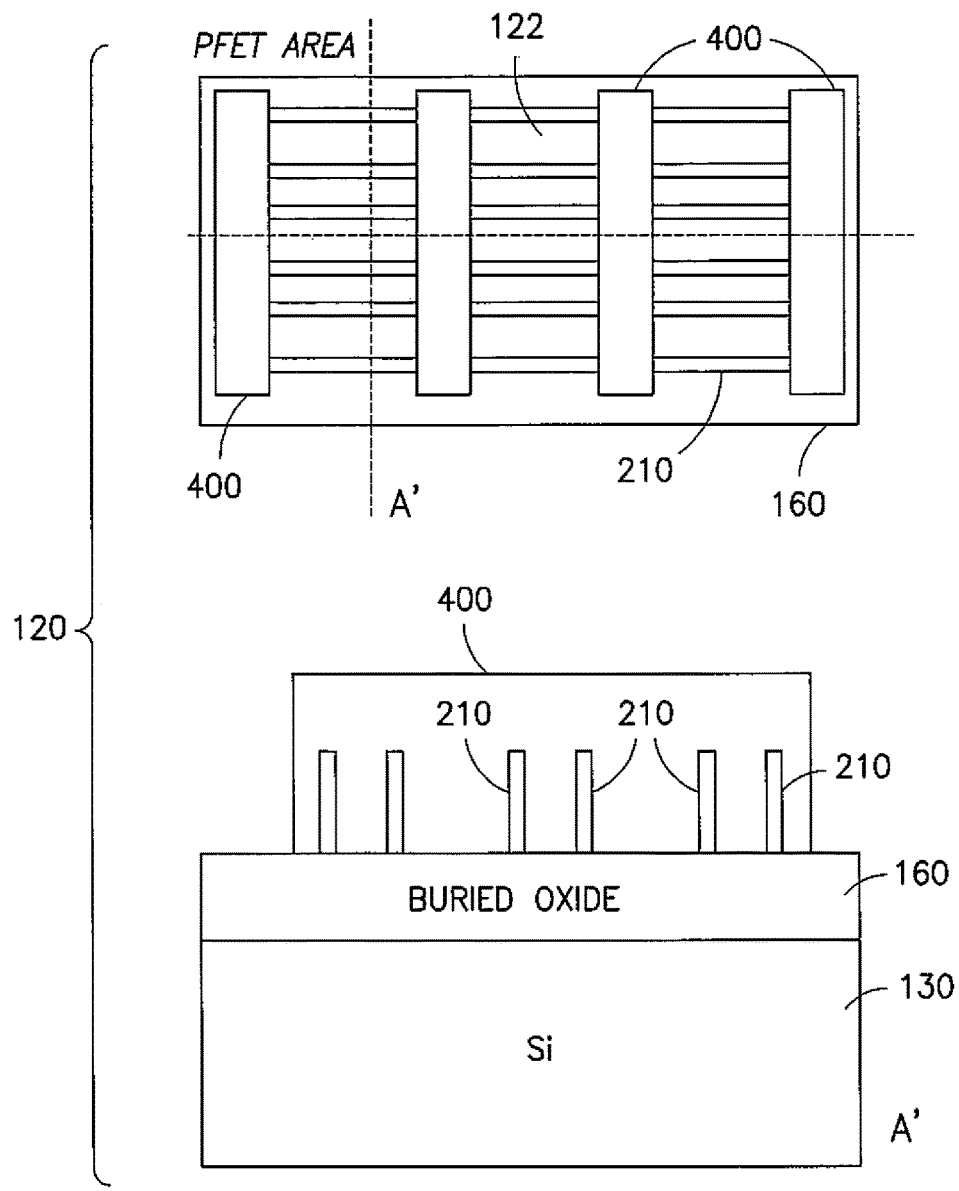

Referring now to FIGS. 4A through 4D, the formation of dummy gates 400 on the mandrels 200 in the NFET area 110 and on the fins 210 in the PFET area 120 is shown. As shown in FIG. 4A, the dummy gates 400 are disposed laterally across the mandrels 200 in the NFET area 110. In doing so, dielectric material is deposited and patterned. As shown in FIG. 4B, the dummy gates 400 extend above the layers of the oxide hardmask 220 on the mandrels 200. Any number of dummy gates 400 may be disposed on the mandrels 200, and as shown in FIG. 4C the dummy gates 400 disposed at the ends of the mandrels 200 may enclose the ends thereof. As shown in FIG. 4D, the dummy gates 400 are disposed laterally across the fins 210 in the PFET area 120. The dummy gates 400 on the fins 210 in the PFET area 120 (like the dummy gates 400 disposed laterally across the mandrels 200 in the NFET area 110) extend above the upper surface of the fins 210. Source/drain regions 122 are formed in the PFET area 120 and extended using epitaxial growth techniques. An optional thermal cycle may be used for diffusion of the material of the extensions.

Figure 5D:
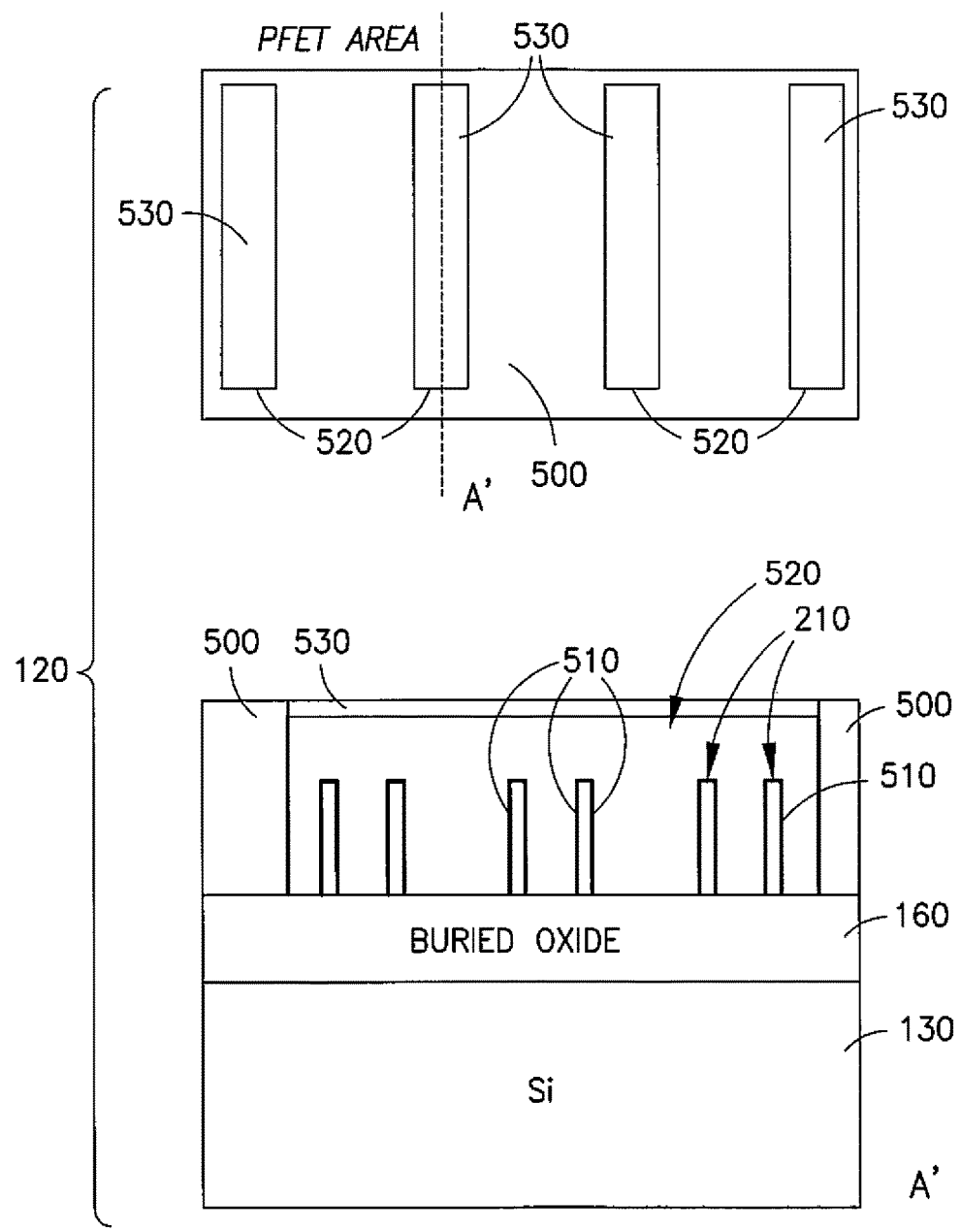

Referring now to FIGS. 5A through 5D, MOL dielectric processing is carried out on the dummy gates. Such processing involves the deposition of an interlayer dielectric 500 (ILD 500) and planarization thereof. Exemplary materials for the ILD 500 include, but are not limited to, silicon dioxide ($SiO_2$). As shown in FIGS. 5A through 5C, the ILD 500 is deposited on the NFET area 110 such that an upper surface of the ILD 500 extends above the upper surface of the layers of the oxide hardmask 220 on the mandrels 200.

As shown in FIG. 5D, the ILD 500 is also deposited on the PFET area 120. The PFET area 120 is subsequently opened to facilitate the removal of the dummy gates 400 over the fins 210 in the PFET area 120. The PFET area 120 may be opened using a chemical mechanical polish (CMP) followed by slightly recessing the ILD 500 with a dry etch process or a wet etch process. The dummy gates 400 in the PFET area 120 are removed using, for example, a combination of a dry etch process (e.g., RIE, plasma etching, or the like) and a wet etch process (e.g., an acid such as hydrofluoric acid (HF)). Once the dummy gates 400 are removed from the PFET area 120, a PFET dielectric layer 510 is disposed on the fins 210 and a PFET replacement metal gate 520 (RMG 520) is disposed over the PFET dielectric layer 510 and the underlying fins 210. A cap 530 of gate hardmask (HM) may be deposited on the PFET RMG 520. The cap 530 may be a dielectric material such as a nitride. The ILD 500 on the PFET area 120 and the PFET RMG 520 (or cap 530) may be planarized. A reliability anneal (e.g., a high-k reliability anneal) may be performed on the substrate 100 and the NFET and PFET structures at this time.

Figure 6A:
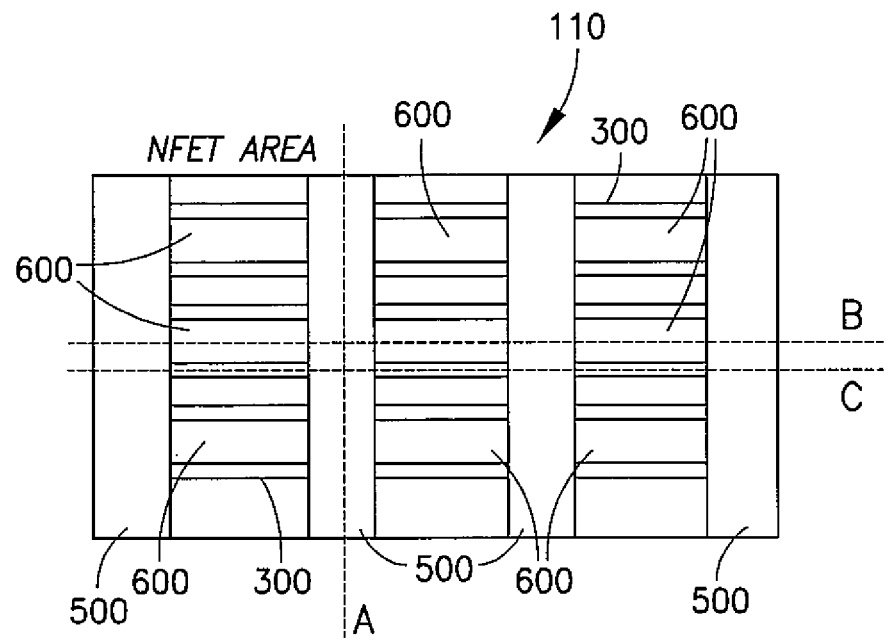
FIGS. 6A through 6D are schematic representations of the formation of recess areas in the NFET area.
Figure 6B:
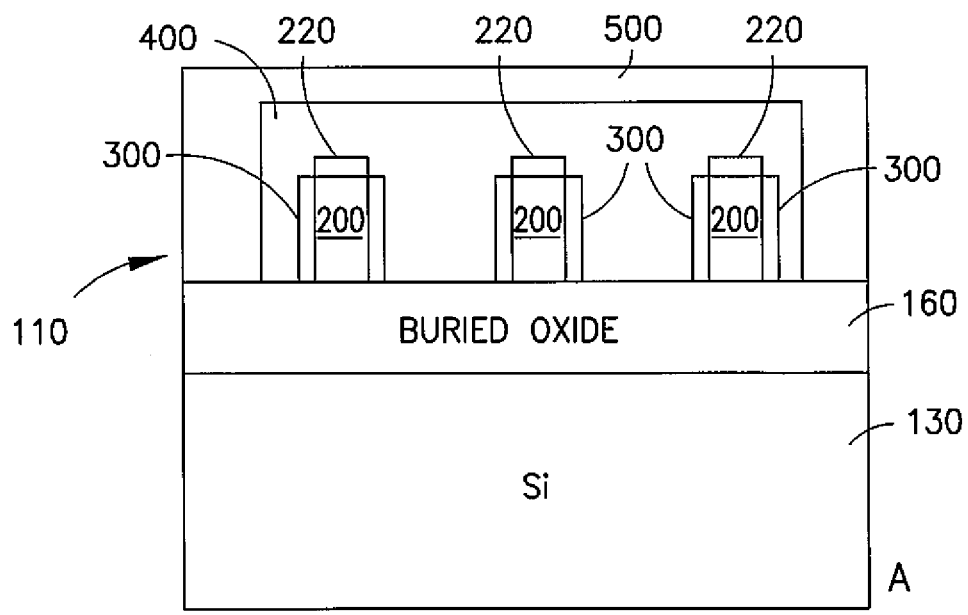
Figure 6C:
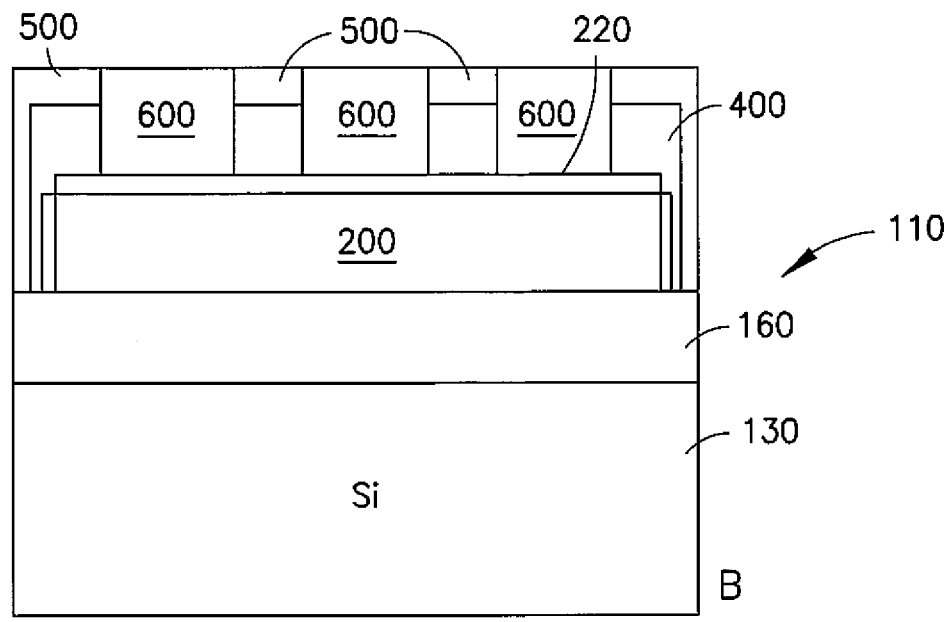
Figure 6D:
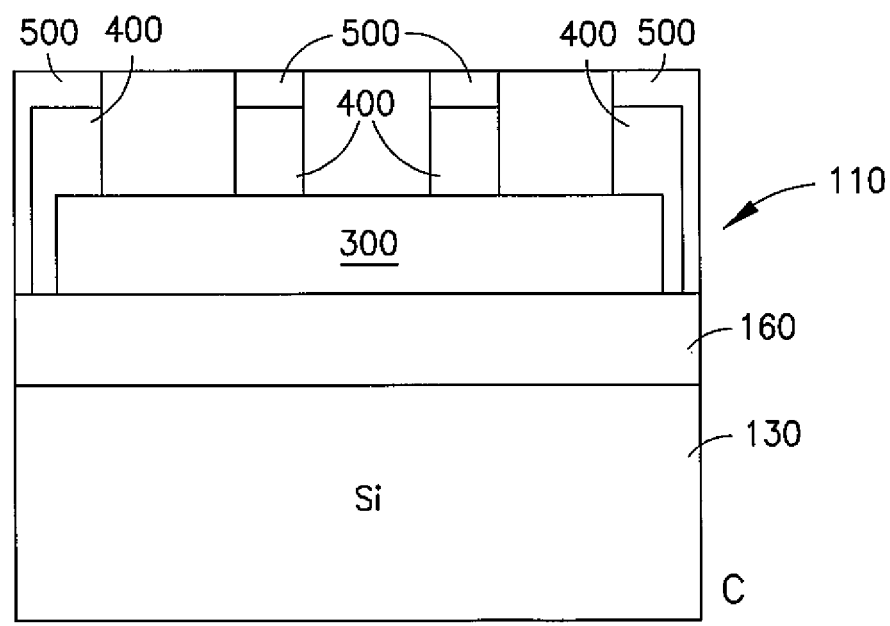
Figure 7A:
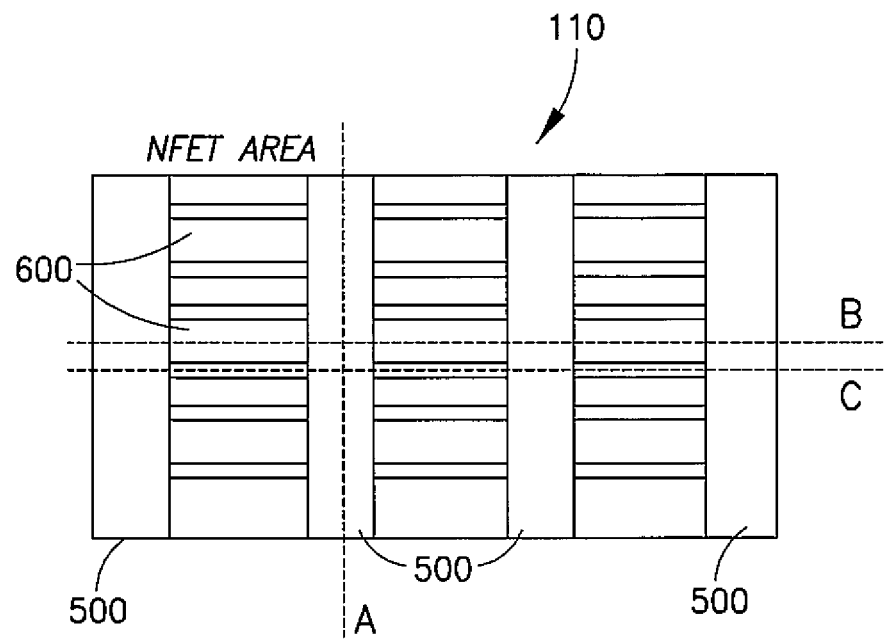
FIGS. 7A through 7D are schematic representations of the removal of the spacers from the NFET area.
Figure 7B:
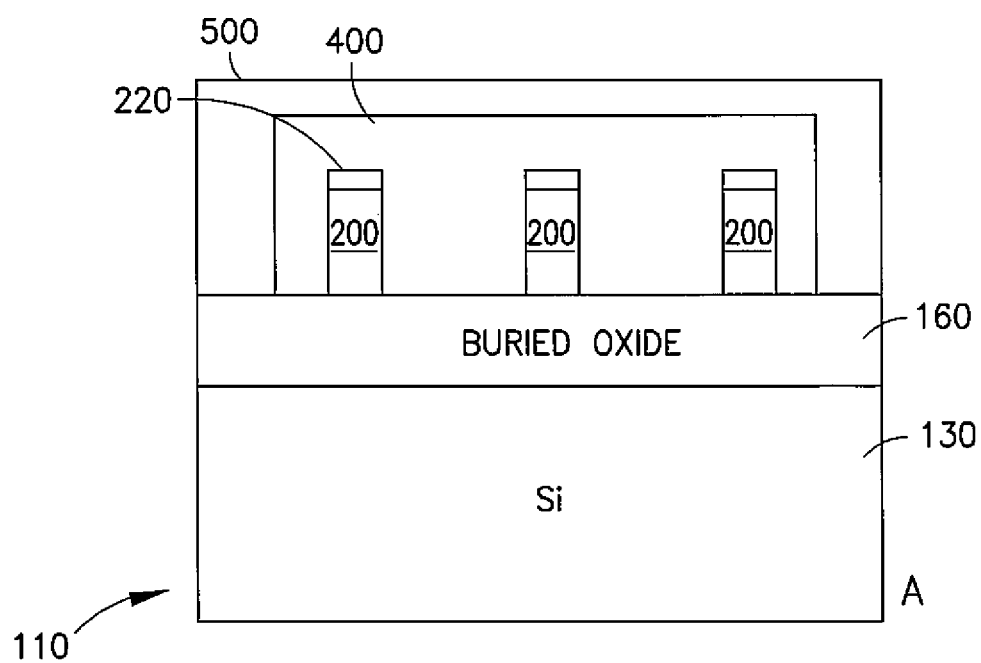
Figure 7C:
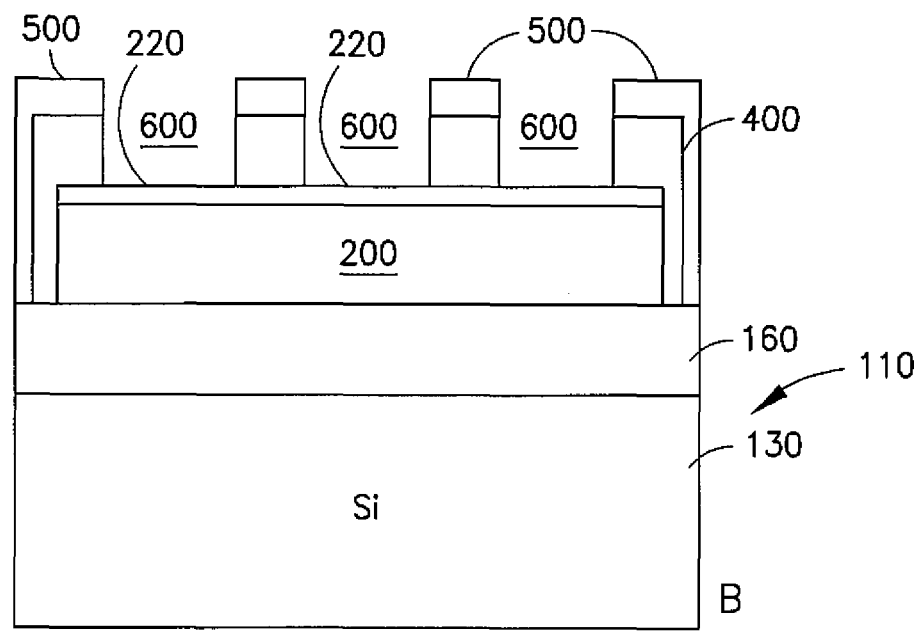
Figure 7D:
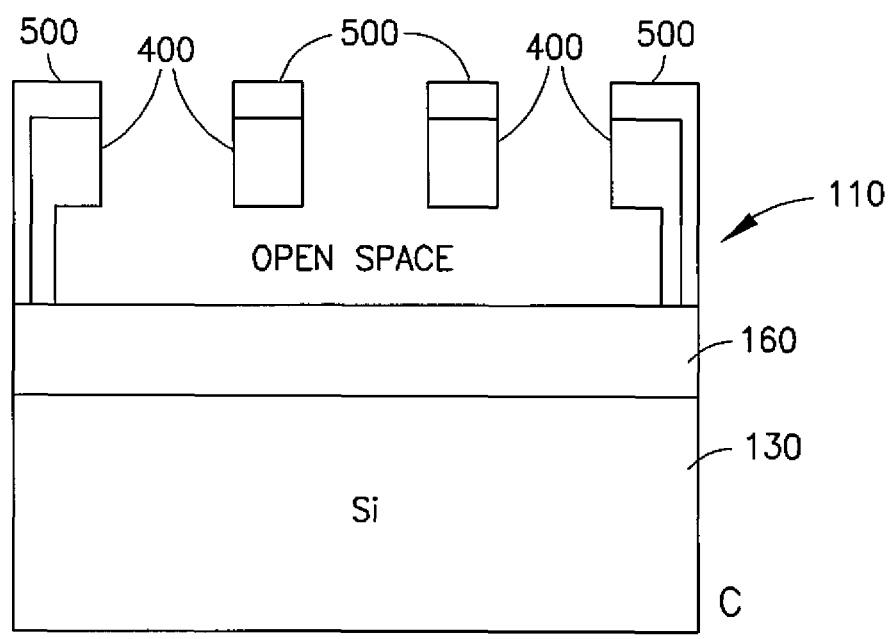
Figure 8A:
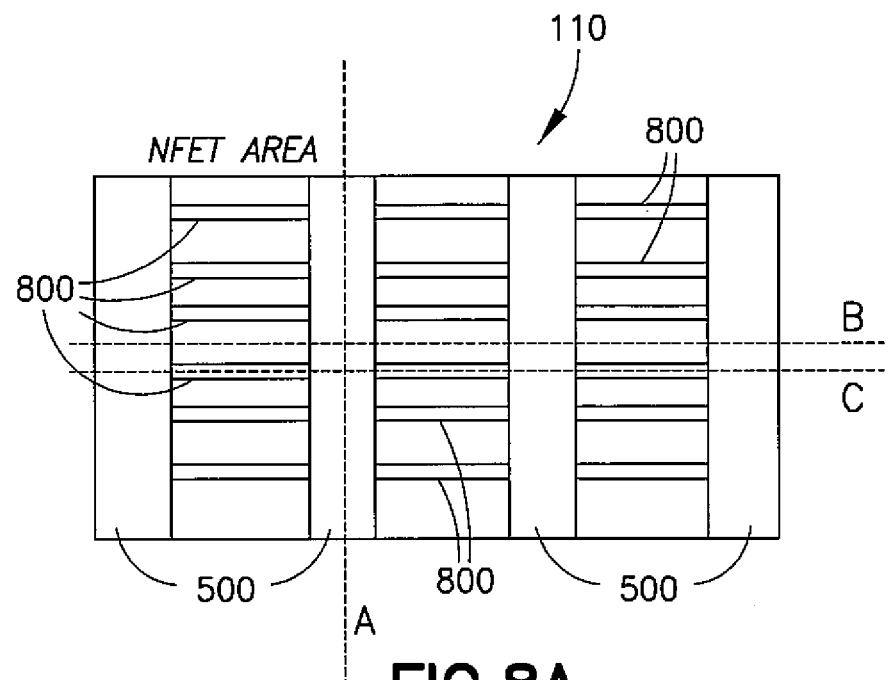
FIGS. 8A through 8D are schematic representations of the epitaxial growth of III-V materials to form sidewalls on the mandrels.
Figure 8B:
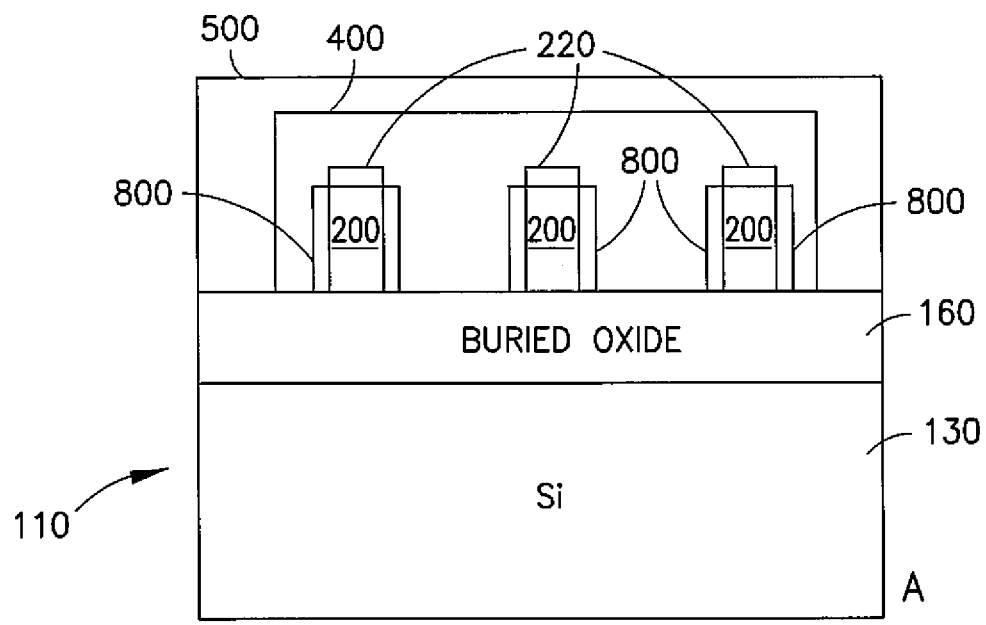
Figure 8C:
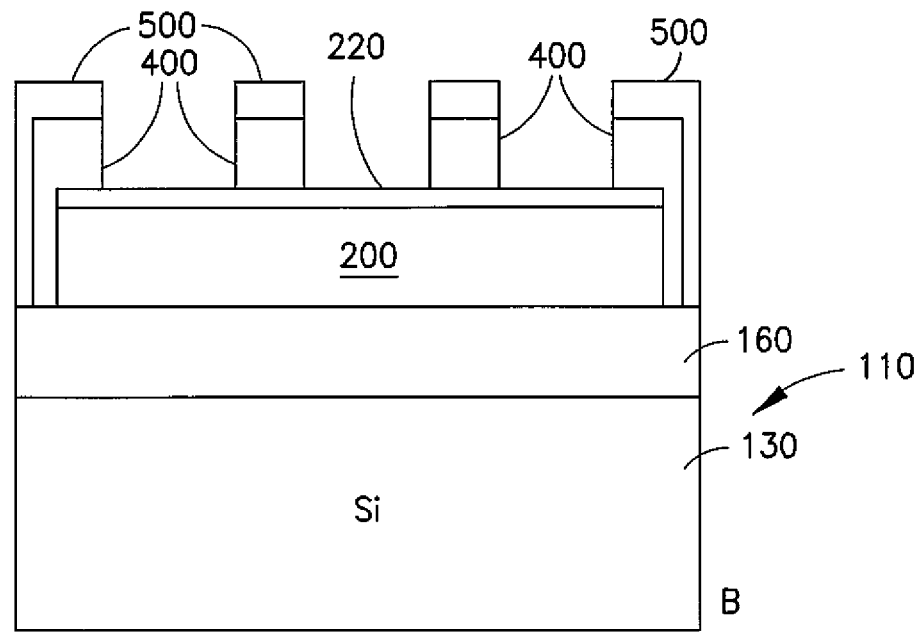
Figure 8D:
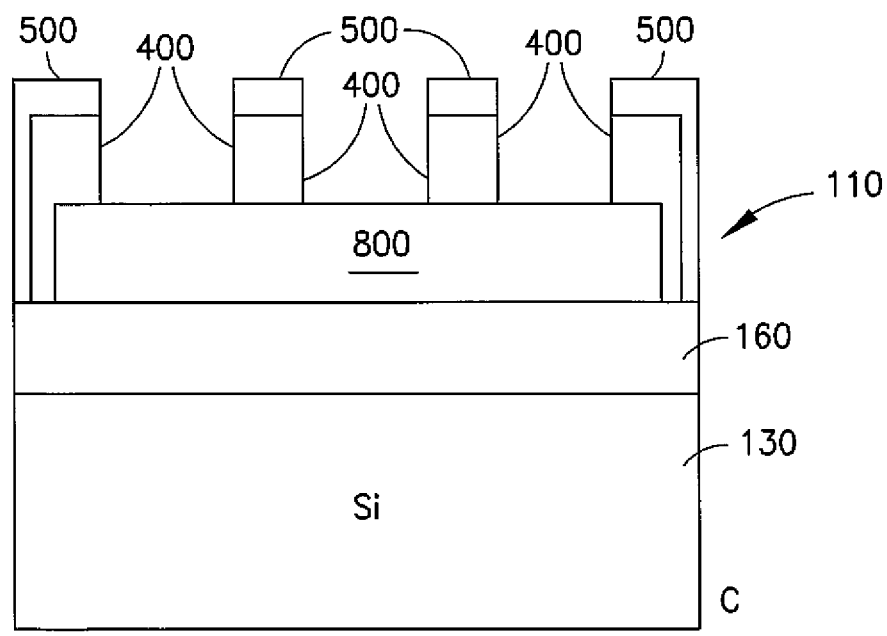

Referring now to FIGS. 6A through 6D, the PFET area 120 is masked and the ILD 500 is recessed from portions of the NFET area 110 to leave recess areas 600 with the mandrel 200 underneath. Exemplary techniques for recessing the ILD 500 include, for example, stripping processes such as, for example, a dry etch process (e.g., RIE), a wet etch process (e.g., HF), or a combination of dry etch and wet etch processes. As can be seen in FIGS. 6C and 6D, the ILD 500 is recessed in the source/drain regions of the NFET area 110.

Referring now to FIGS. 7A through 7D, the PFET area 120 remains masked, and an isotropic removal of the spacers 300 in the NFET area 110 is carried out. The spacers 300 are removed using any suitable etching process, such as, for example, plasma etching (e.g., a downstream plasma etch) or a wet etch process (e.g., phosphoric acid ($H_3PO_4$) or other nitride etch).

Referring now to FIGS. 8A through 8D, the PFET area 120 remains masked, and undoped III-V material is epitaxially grown on the mandrels 200 in the NFET area 110. The epitaxial growth of the III-V material forms sidewalls 800 of III-V material. In some exemplary embodiments, the sidewalls 800 may be epitaxially grown by seeding vertical surfaces of the mandrels 200 using desired III-V seed materials and maintaining a preselected temperature and pressure to initiate the growth. Example III-V materials grown on the mandrels 200 include, but are not limited to, InGaAs, GaAs, and the like. The III-V materials grown on the mandrels 200 form channel structures in the NFET area 110.

Referring now to FIGS. 9A through 9D, the mandrels 200 are removed from the source/drain regions and outside the gate areas of the NFET area 110. Portions of the mandrels 200 remain under the dummy gates 400. Exemplary methods by which the mandrels 200 may be removed include anisotropic selective wet-etching techniques (e.g., tetramethylammonium hydroxide (TMAH) or potassium hydroxide (KOH), ammonium hydroxide ($NH_4OH$), or the like) or dry-etching techniques (e.g., $XeF_2$, $HBr/O_2$, and the like).

Figure 9A:
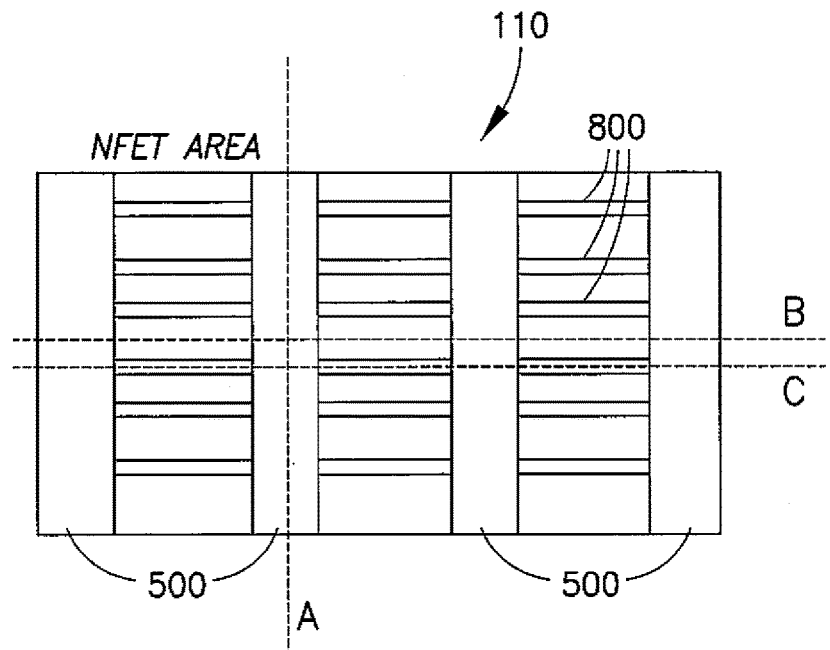
FIGS. 9A through 9D are schematic representations showing the removal of portions of the mandrels from the NFET area.
Figure 9B:
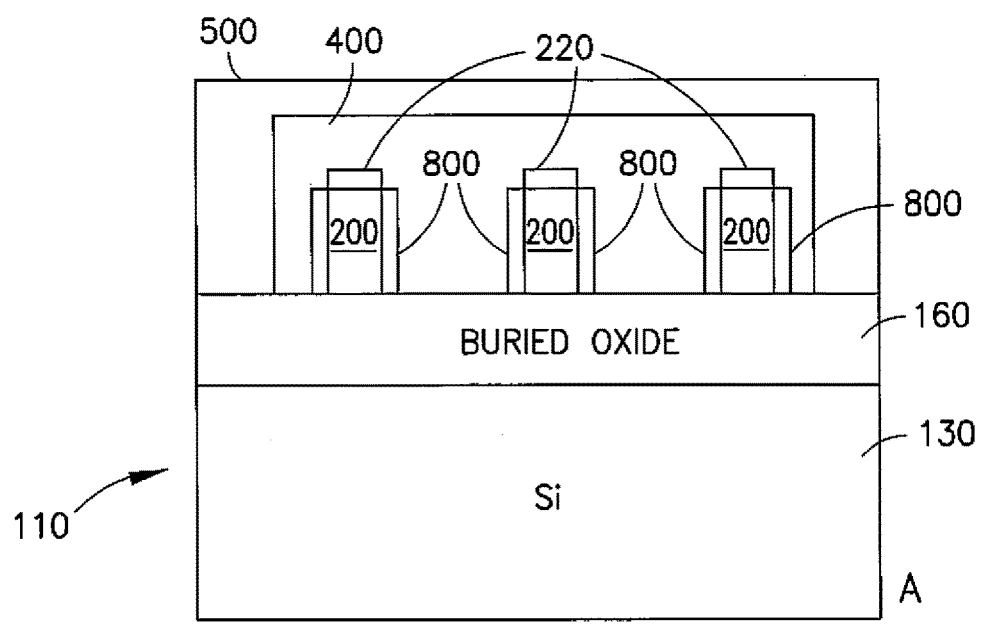
Figure 9C:
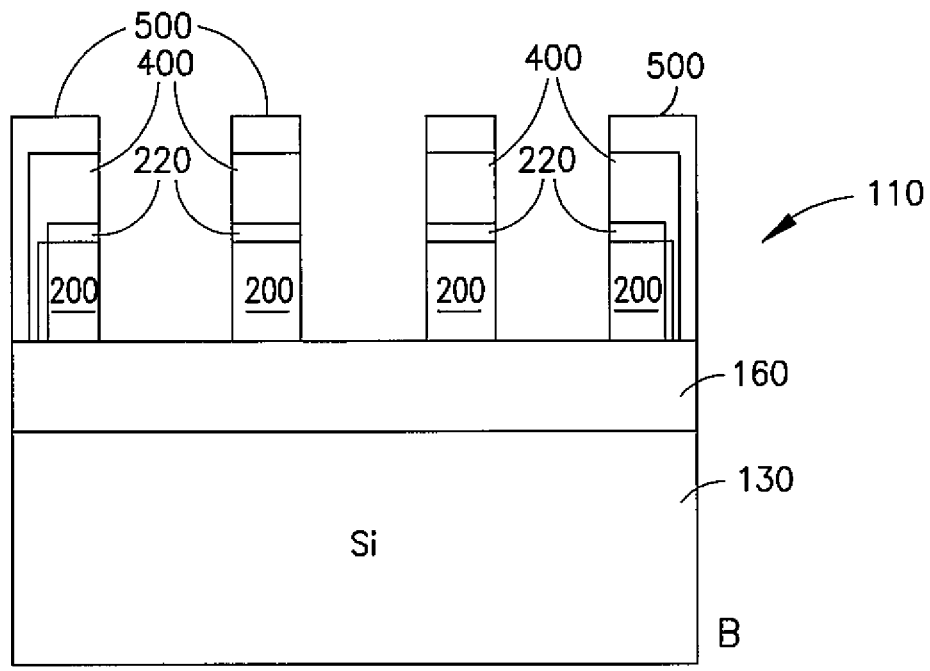
Figure 9D:
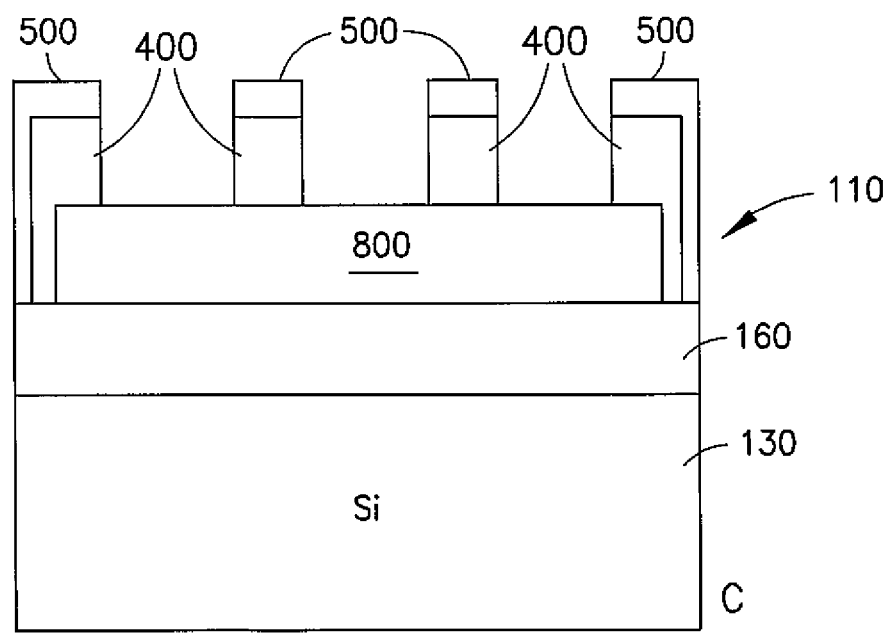
Figure 10A:
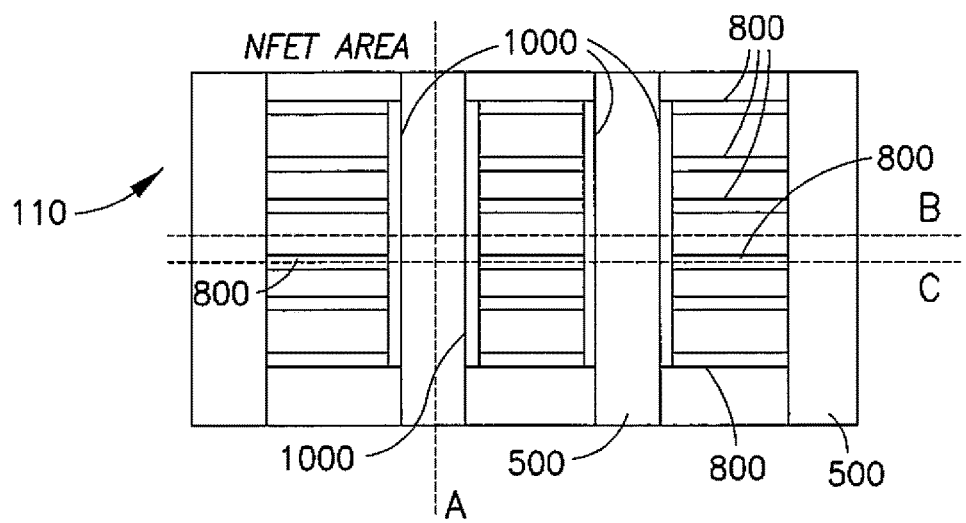
FIGS. 10A through 10D are schematic representations showing the formation of additional spacers in the NFET area.
Figure 10B:
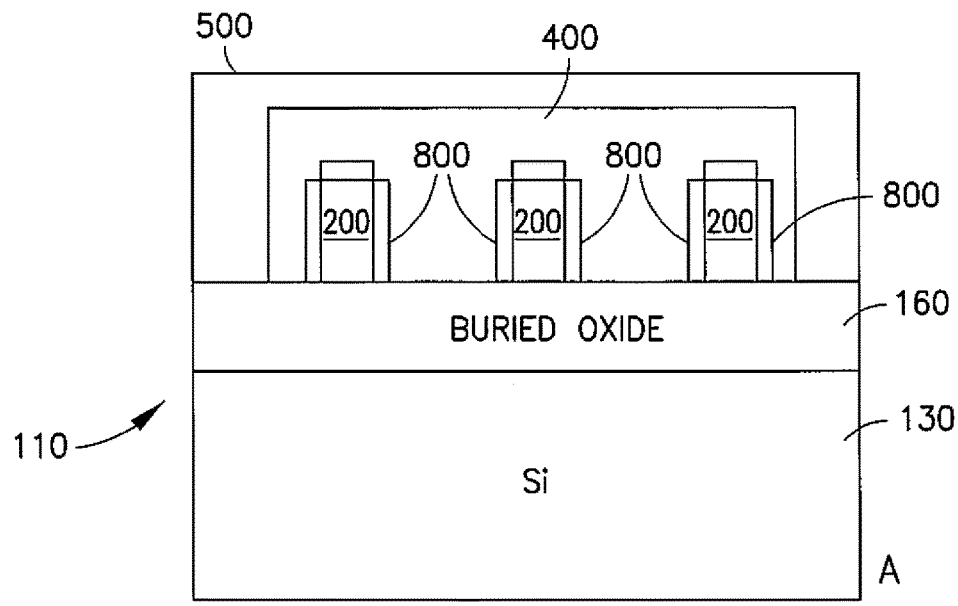
Figure 10C:
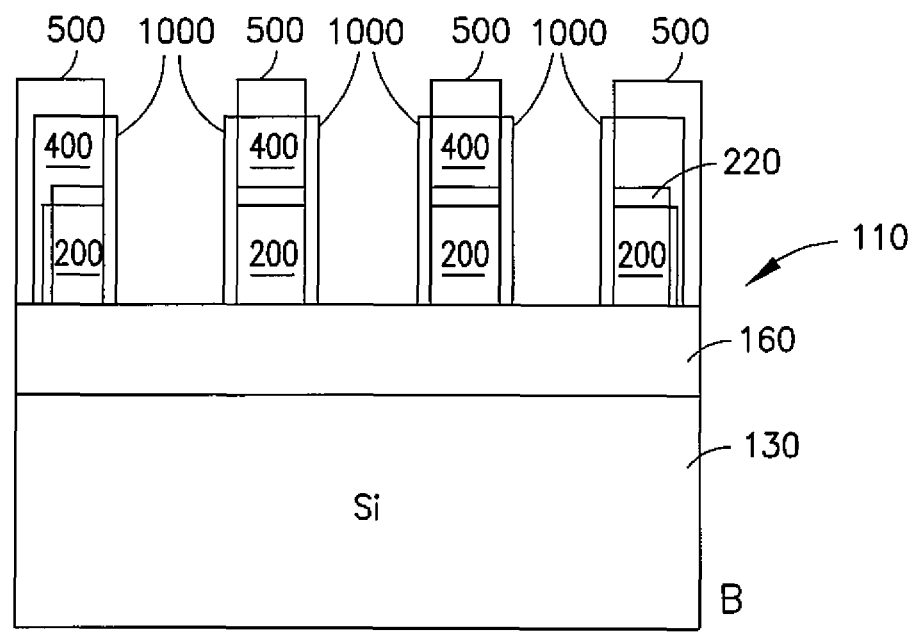
Figure 10D:
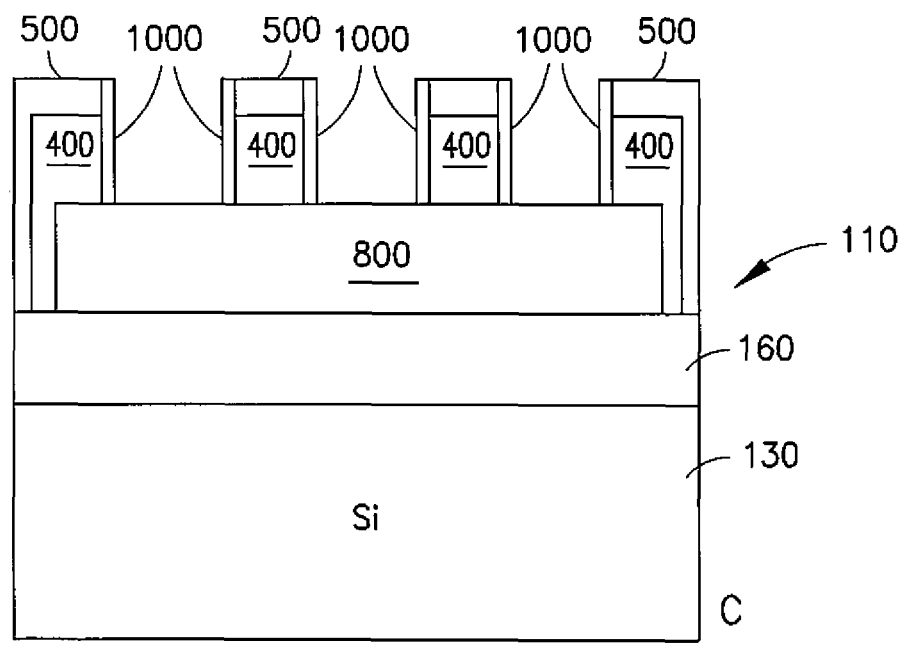
Figure 11A:
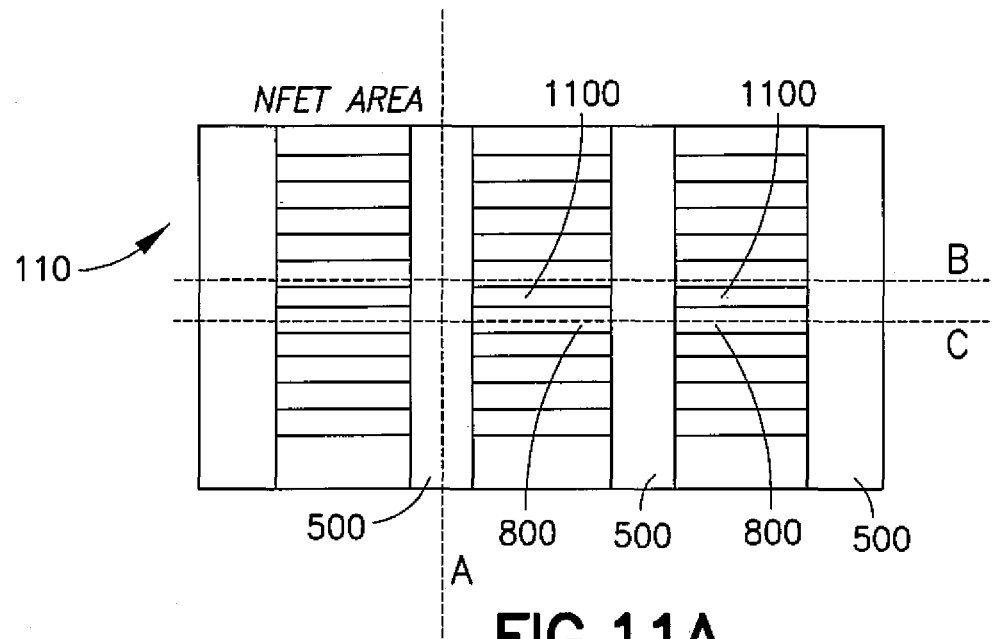
FIGS. 11A through 11D are schematic representations showing the formation of source/drain regions in the NFET area.
Figure 11B:
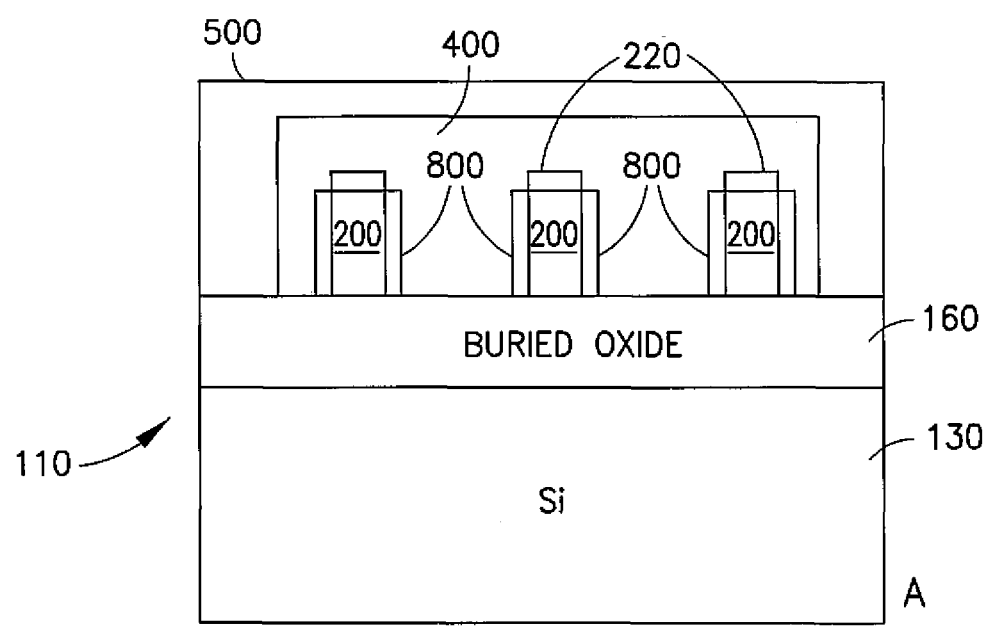
Figure 11C:
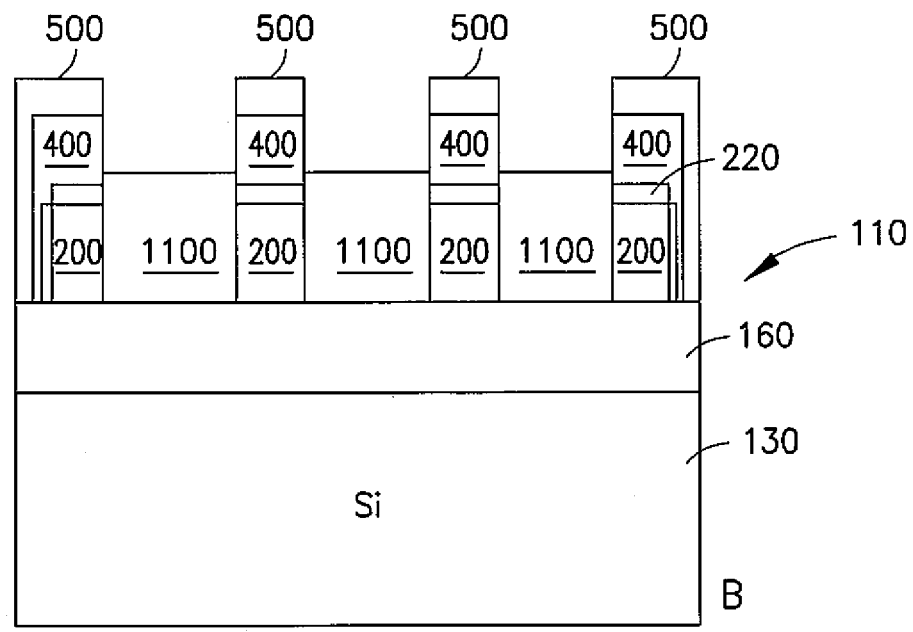
Figure 11D:
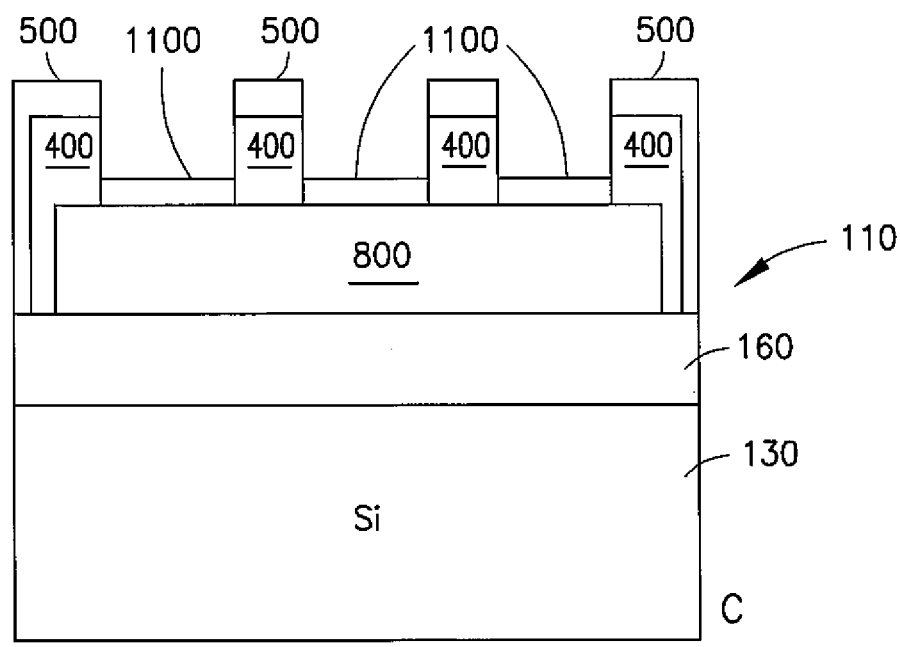
Figure 12A:
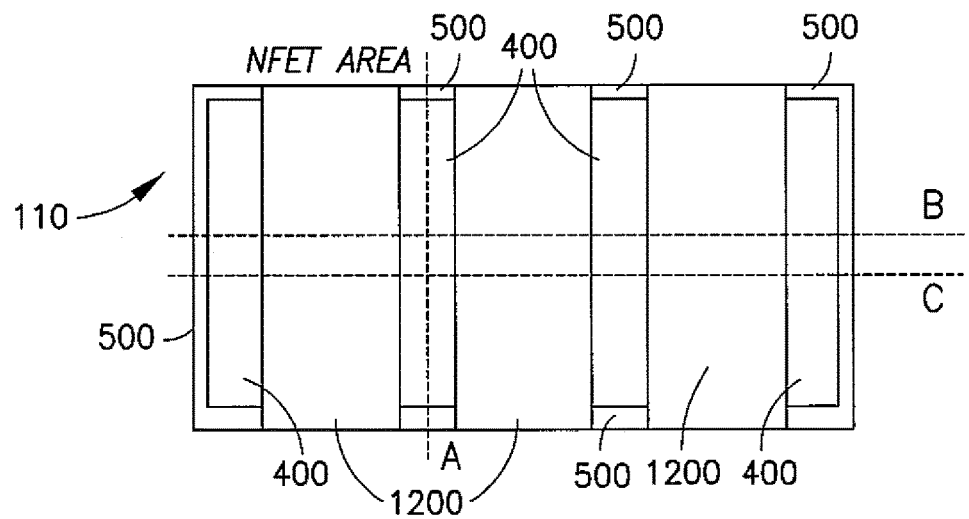
FIGS. 12A through 12D are schematic representations of a second interlayer dielectric disposed on the NFET area.
Figure 12B:
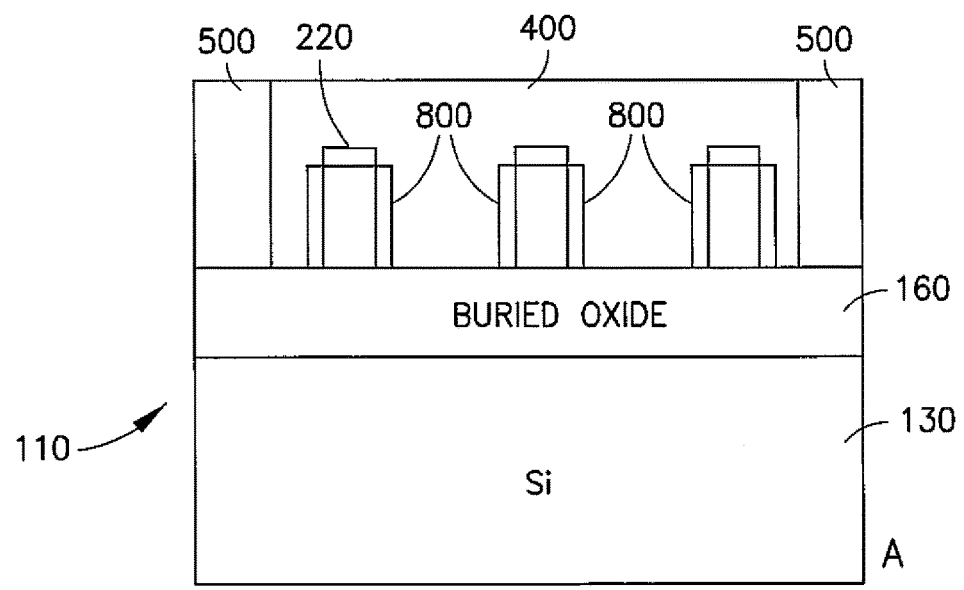
Figure 12C:
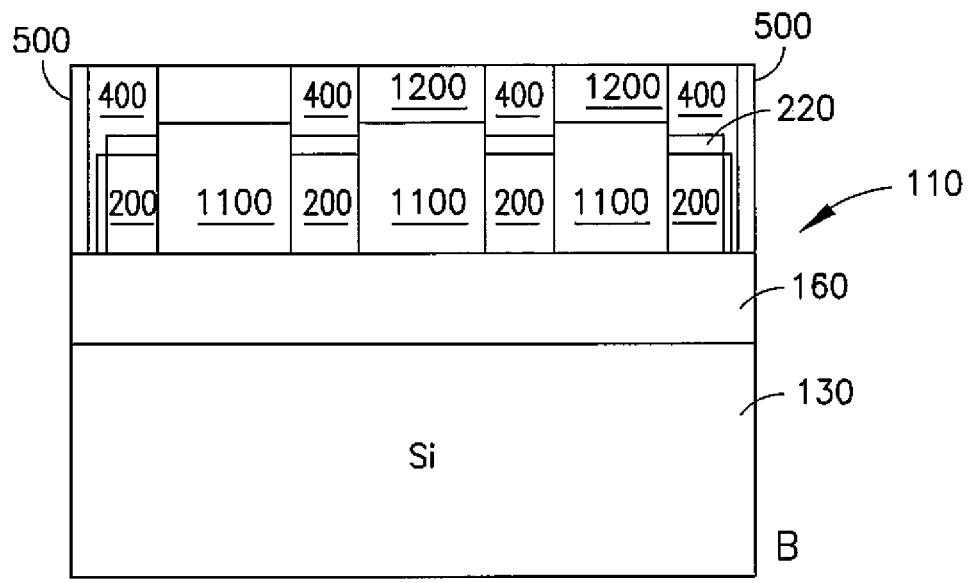
Figure 12D:
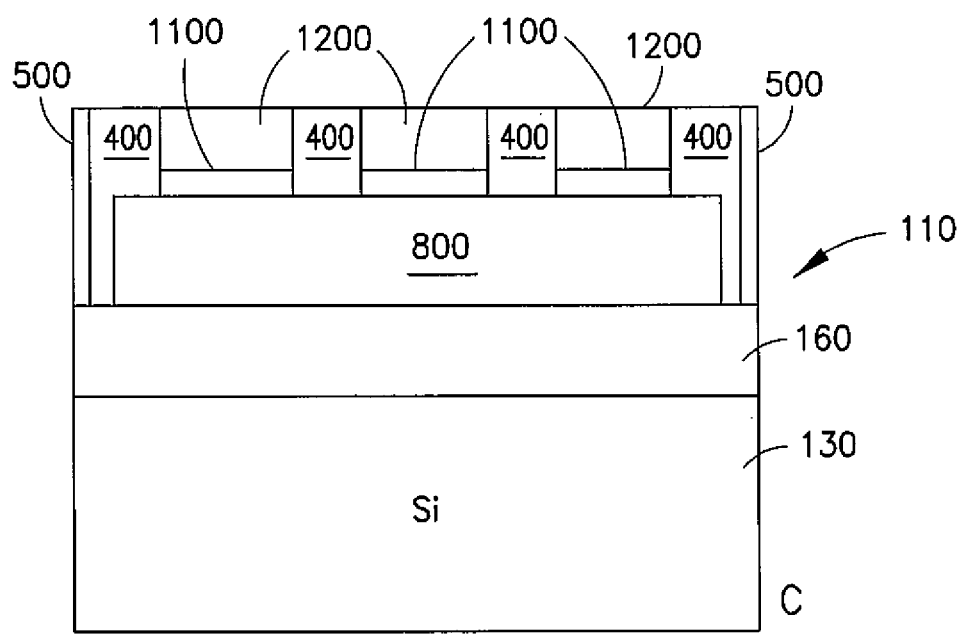
Figure 13A:
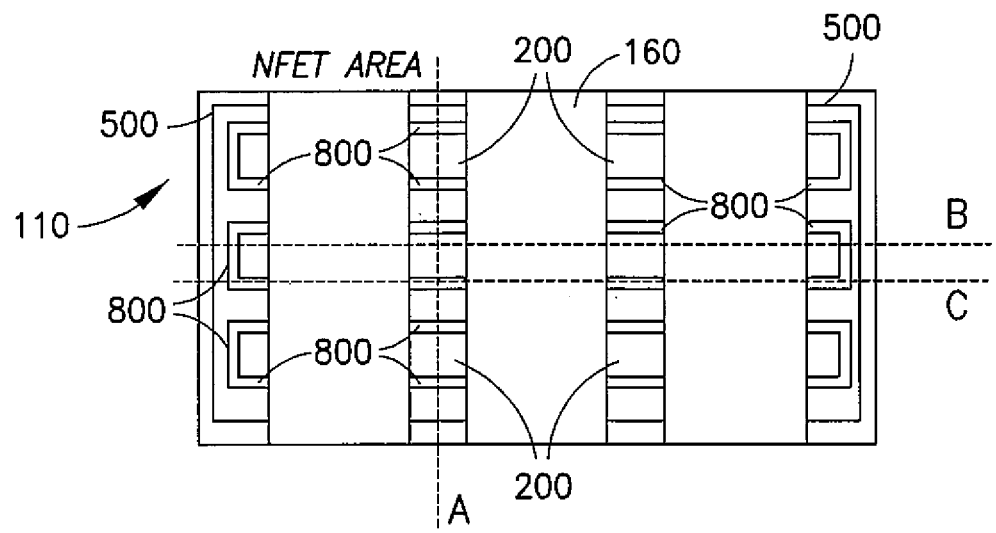
FIGS. 13A through 13D are schematic representations of the removal of portions of the dummy gates from the NFET area.
Figure 13B:
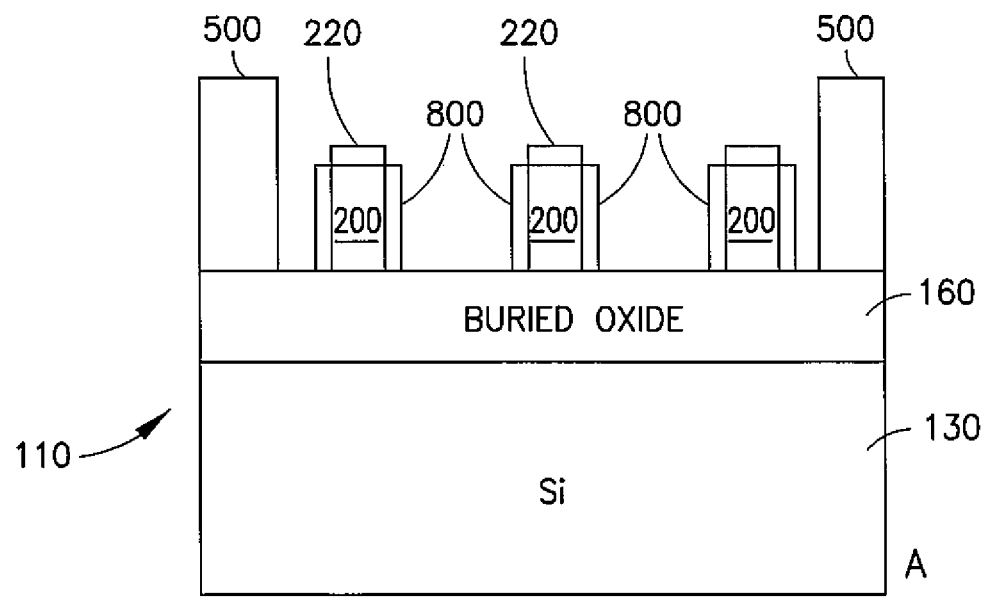
Figure 13C:
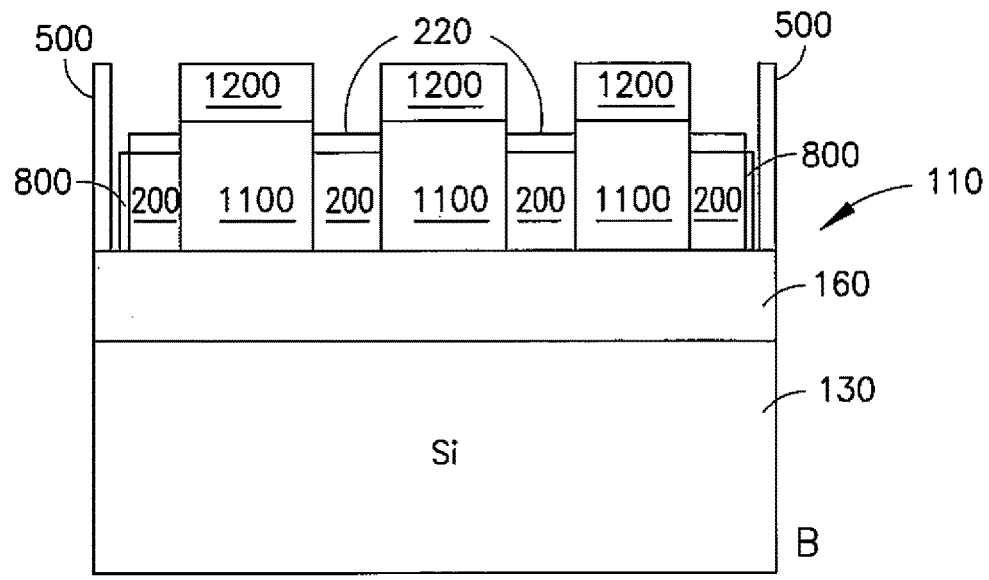
Figure 13D:
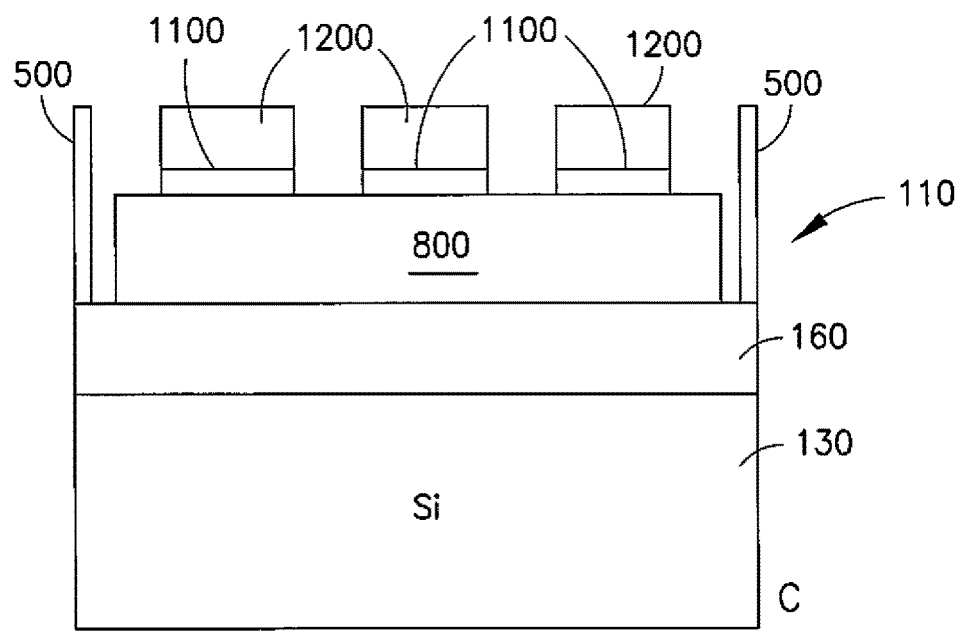

As shown in FIG. 9C, the removal of the mandrels 200 exposes portions of the upper surface of the BOX layer 160.

Referring now to FIGS. 10A through 10D, in some exemplary embodiments, additional spacers 1000 may be disposed in the NFET area 110. The additional spacers 1000 are optional and may be transverse to the sidewalls 800 of III-V material.

Referring now to FIGS. 11A through 11D, n+ source/drain regions 1100 are formed in the NFET area 110 by epitaxially growth. Materials used to form the n+ source/drain regions 1100 may include. III-V materials such as InGaAs or InAs or the like. Epitaxial growth of the material(s) is generally selective to oxide and nitride.

Referring now to FIGS. 12A through 12D, a second ILD 1200 (e.g., $SiO_2$) is deposited Over the NFET area 110 and on the source/drain regions 1100. The second ILD 1200 is then planarized, followed by a recessing process to expose the upper surface of the dummy gates 400. The second ILD 1200 is a second MOL dielectric material such as $SiO_2$.

Referring now to FIGS. 13A through 13D, the dummy gates 400 in the NFET area 110 are removed (e.g., using a combination of a dry etch process and a wet etch process), thereby exposing underlying structure.

Figure 14A:
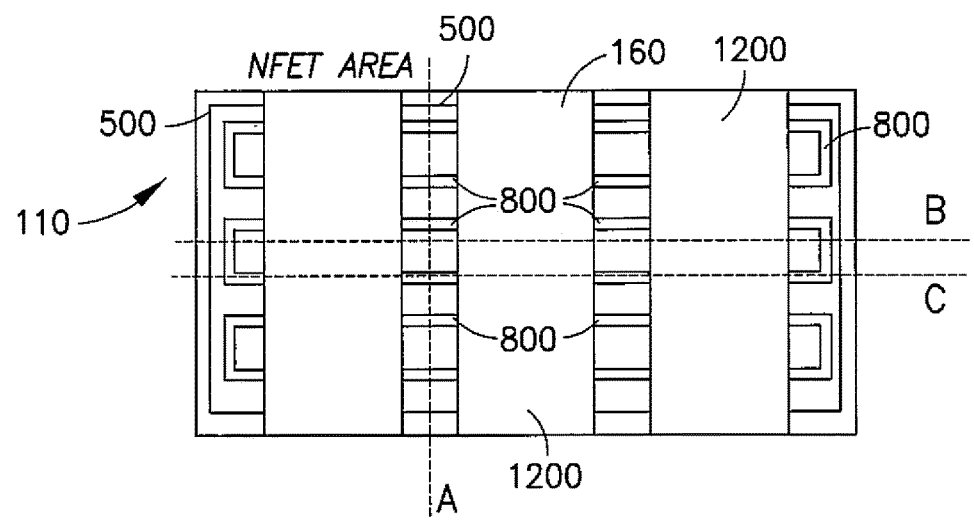
FIGS. 14A through 14D are schematic representations of the removal of the mandrels from under the remaining portions of the dummy gates in the NFET area.
Figure 14B:
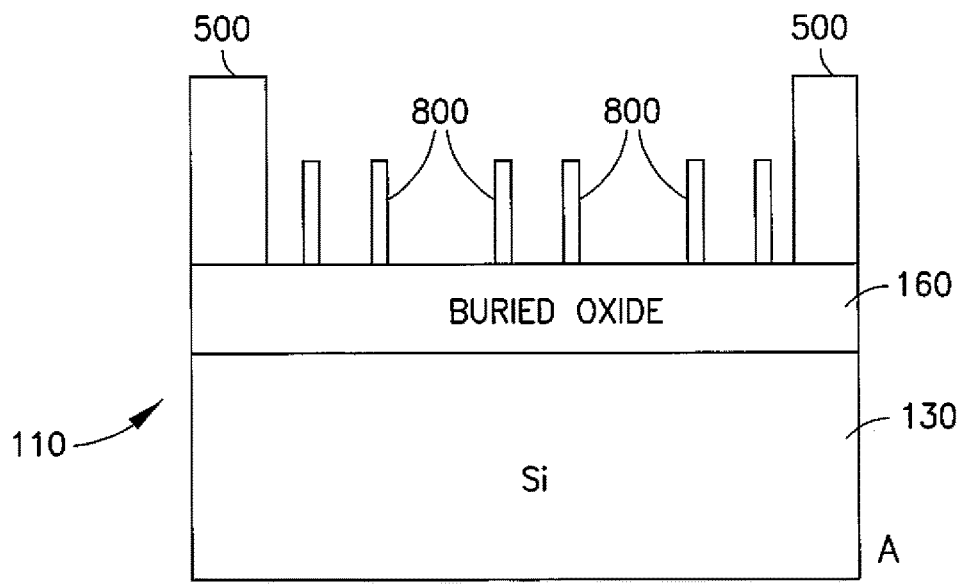
Figure 14C:
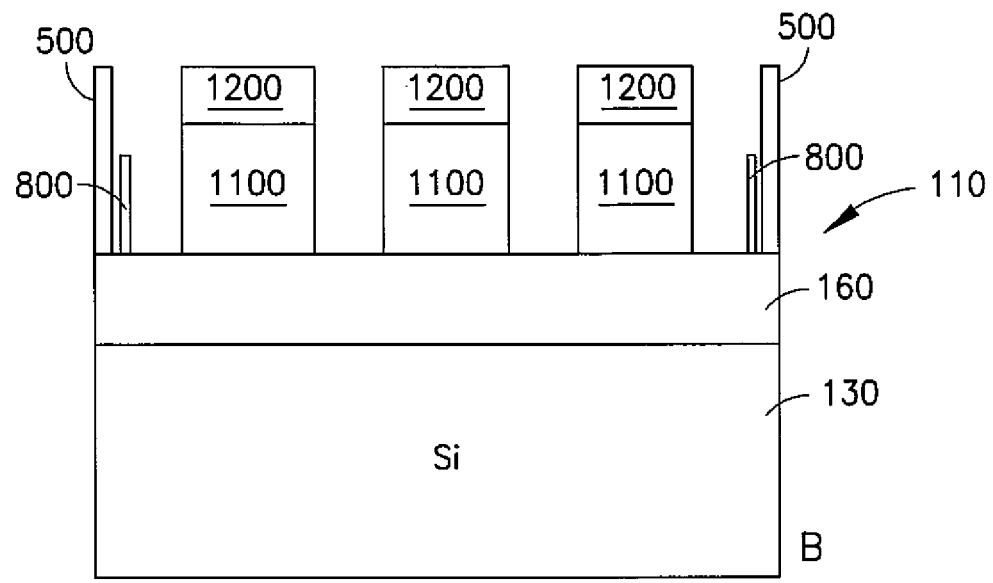
Figure 14D:
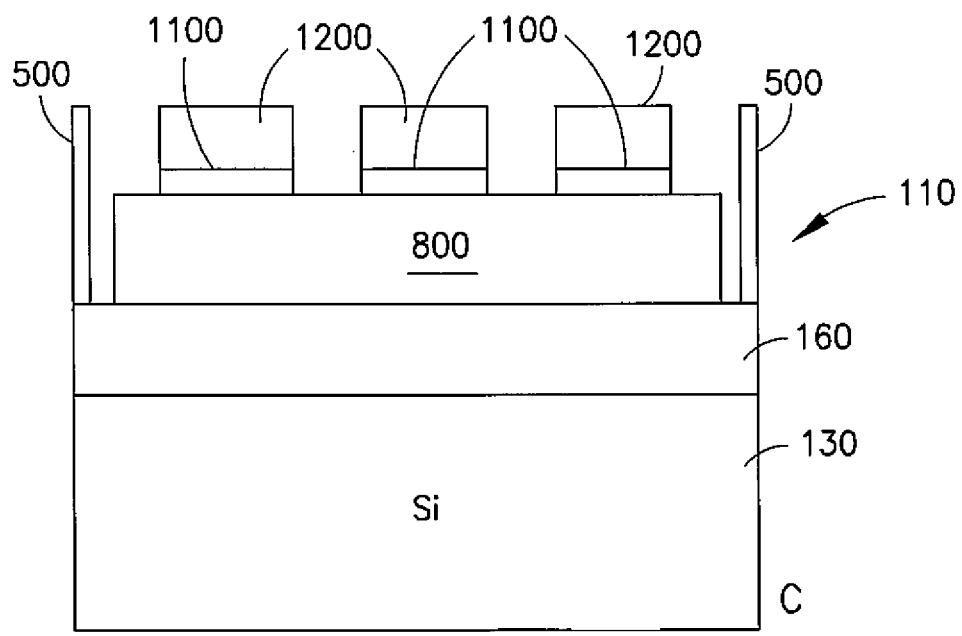
Figure 15A:
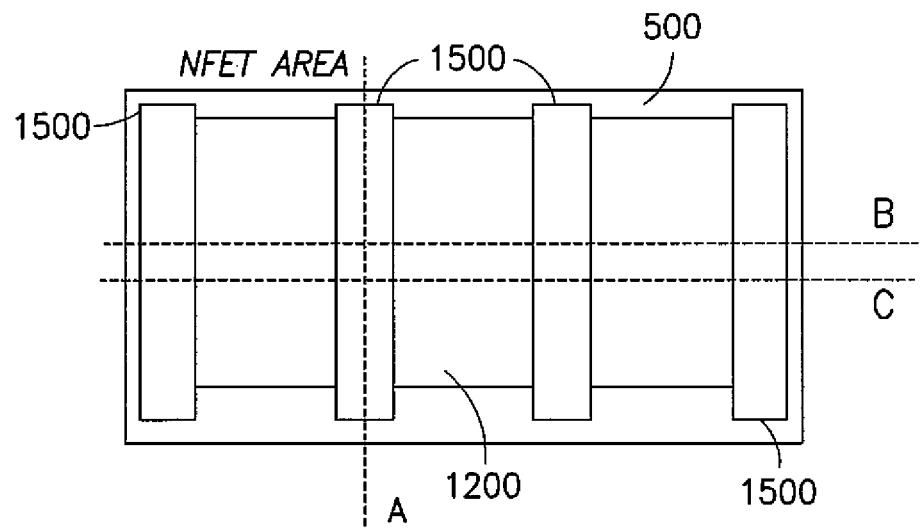
FIGS. 15A through 15D are schematic representations of the formation of replacement metal gates in the NFET area.
Figure 15B:
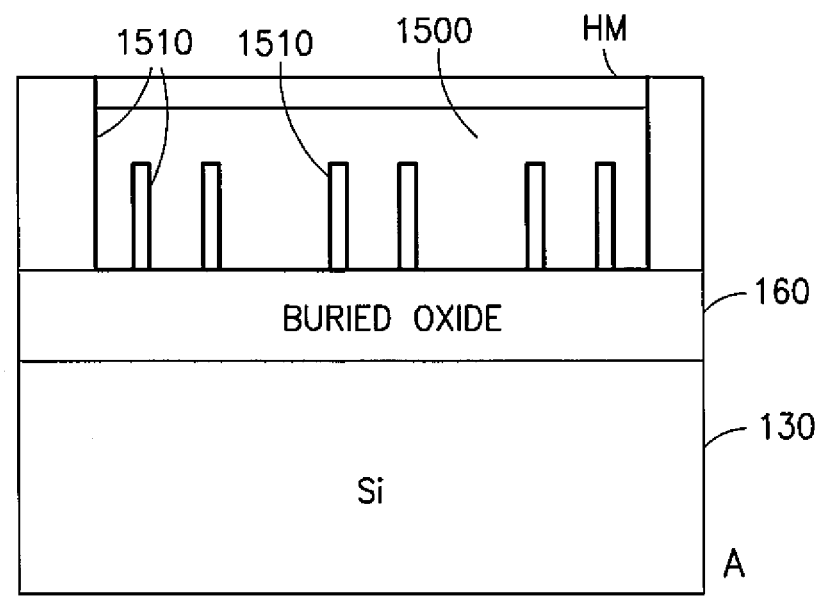
Figure 15C:
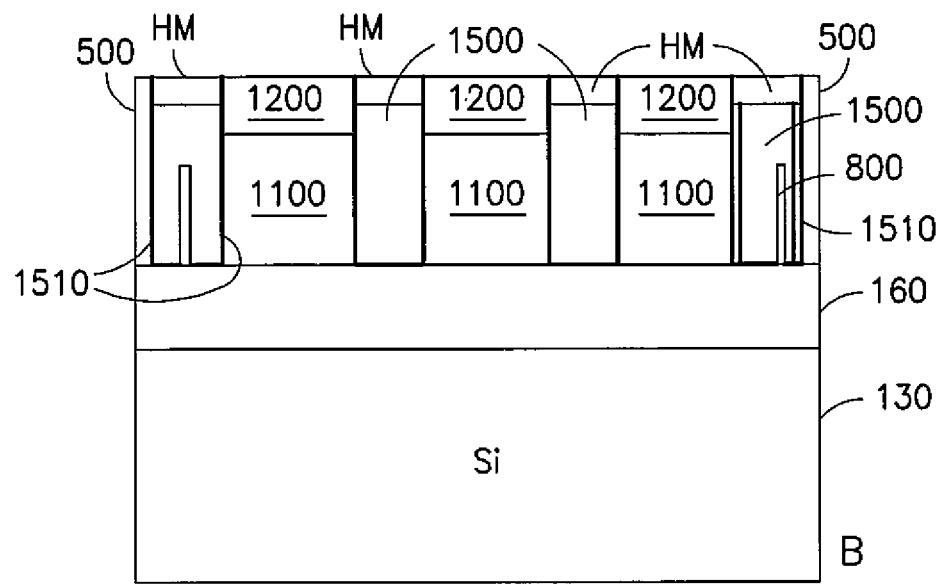
Figure 15D:
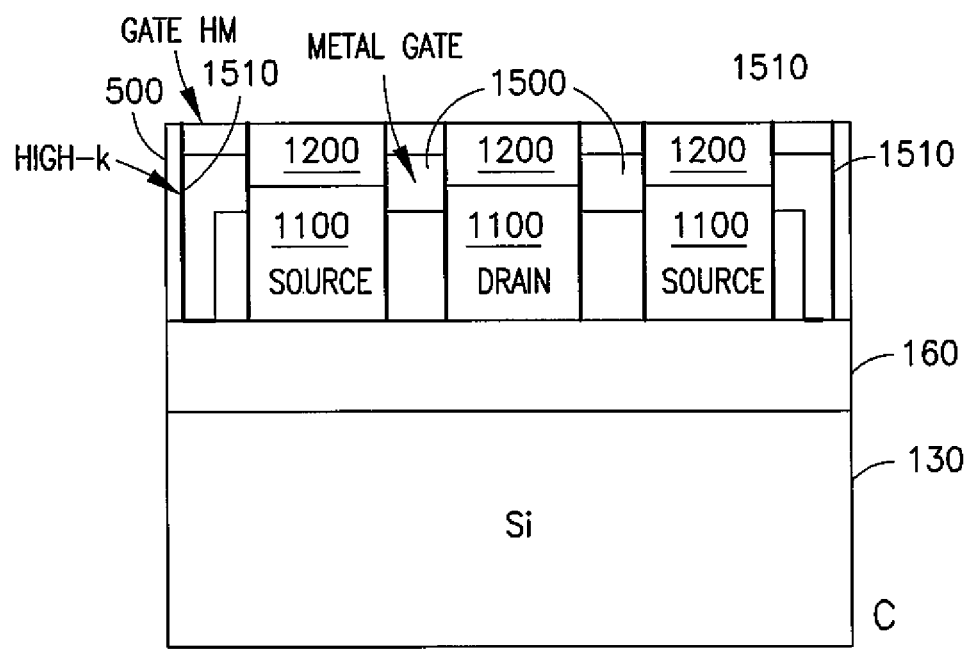

Referring now to FIGS. 14A through 14D, once the dummy gates 400 are removed from the NFET area 110, the portions of the mandrels 200 previously under the dummy gates 400 are removed. The mandrel portions may be removed by, for example, the anisotropic selective wet-etching techniques or dry-etching techniques. As shown in FIG. 14B through 14D, the sidewalls 800 remain in place.

Referring now to FIGS. 15A through 15D, one or more RMGs 1500 is formed in the NFET area 110 to replace the removed dummy gates 400. An NFET high-k dielectric layer 1510 is deposited on the inner vertical walls of the remaining ILD 500, on the upper surface of the exposed BOX layer 160, and on the surfaces of the sidewalls 800. A gate metal is then deposited on the NFET high-k dielectric layer 1510 to form the NFET RMG 1500 in the NFET area 110. The upper surface of the NFET area 110 may be planarized. The NFET RMGs 1500 may be capped with gate HM. Any desired MOL processing may then be continued.

Referring now to FIG. 16, a simplified block diagram of various electronic devices and apparatuses that are suitable for use in practicing the exemplary embodiments described herein is shown. For example, a computer 1610 may be used to control one or more of the processes as described above. The computer 1610 may include a controller, such as a computer or a data processor (DP) 1614 and a computer-readable memory medium embodied as a memory (MEM) 1616 that stores a program of computer instructions (PROG) 1618.

The PROG 1618 may include program instructions that, when executed by the associated DP 1614, enable the various electronic devices and apparatuses to operate in accordance with exemplary embodiments. That is, various exemplary embodiments may be implemented at least in part by computer software executable by the DP 1614 of the computer 1610, or by hardware, or by a combination of software and hardware (and firmware).

The computer 1610 may also include dedicated processors, for example a processor 1615 that controls the conditions for growth of the III-V material.

The computer readable MEM 1616 may be of any type suitable to the local technical environment and may be implemented using any suitable data storage technology, such as semiconductor based memory devices, flash memory, magnetic memory devices and systems, optical memory devices and systems, fixed memory, and removable memory. The DP 1614 may be of any type suitable to the local technical environment, and may include one or more of general purpose computers, special purpose computers, microprocessors, digital signal processors (DSPs), and processors based on a multicore processor architecture, as non-limiting examples.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise utilizing the exemplary embodiments of the method.

Based on the foregoing, it should be apparent that various exemplary embodiments provide methods to epitaxially grow III-V material after deposition of the MOL dielectric and the PFET RMG.

Figure 17A:
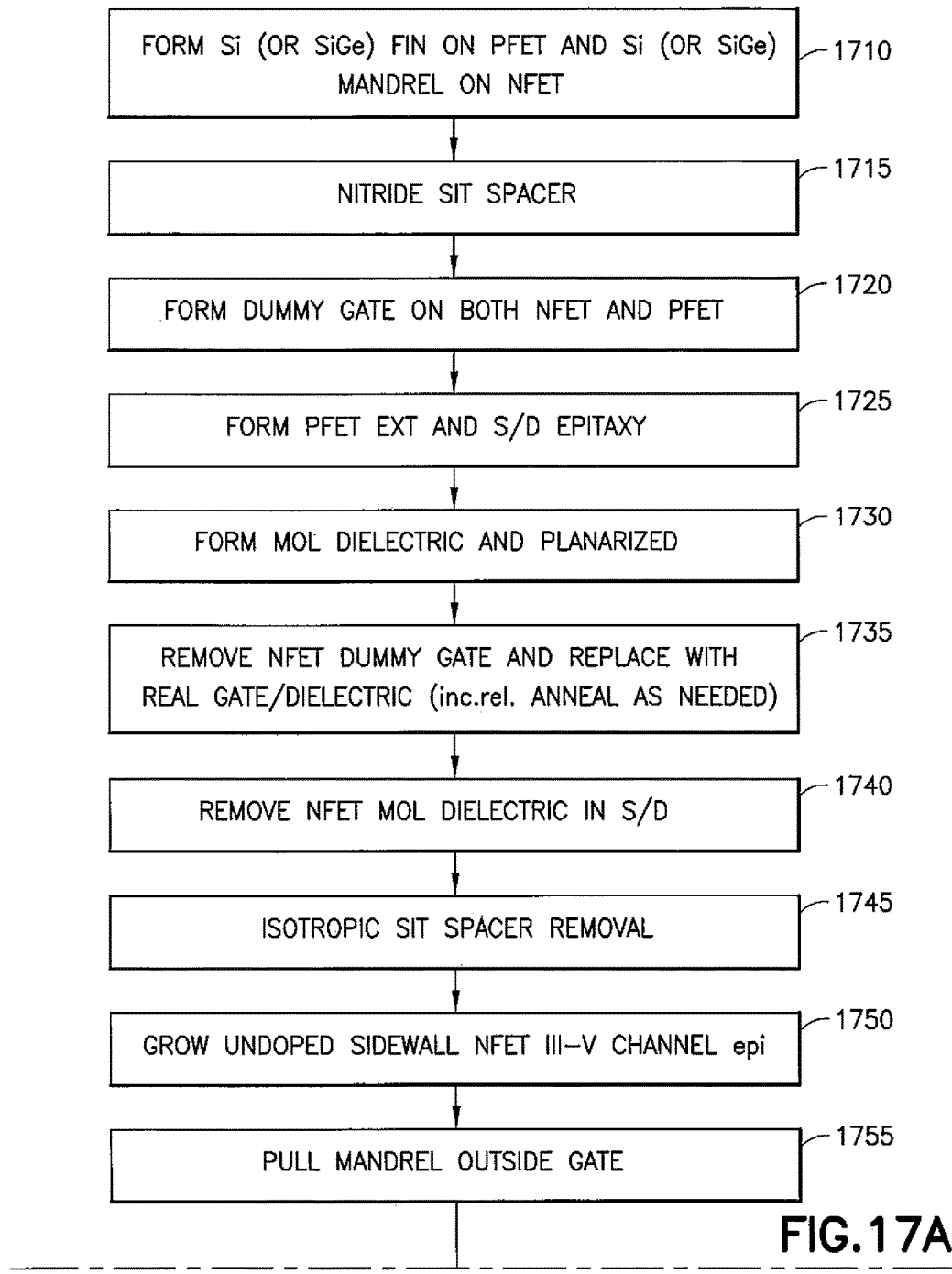
FIG. 17 is a logic flow diagram that illustrates the operation of an exemplary method, and a result of execution of computer program instructions embodied on a computer readable memory, in accordance with an exemplary embodiment of the manufacture of structures described herein.
Figure 17B:
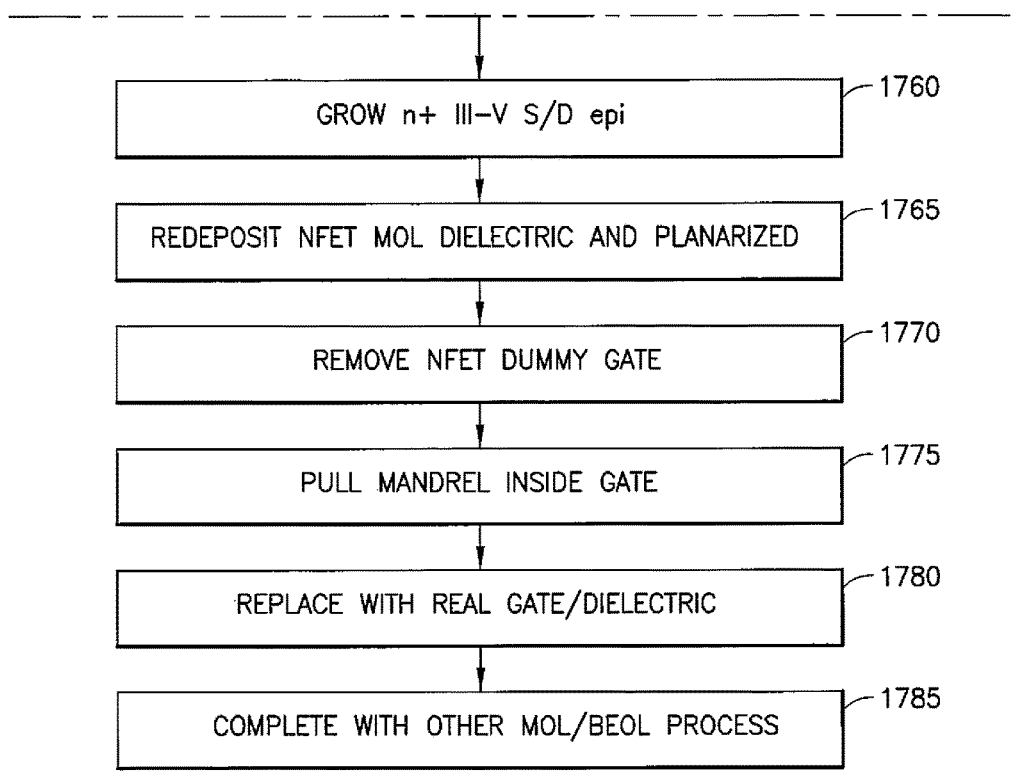

FIG. 17 is a logic flow diagram that illustrates the operation of one exemplary method 1700 (and a result of an execution of computer program instructions (such as PROG 1618)), in accordance with the exemplary embodiments. In accordance with these exemplary embodiments, at block 1710, silicon (or SiGe) fins may be formed on the PFET area of the substrate, and silicon (or SiGe) mandrels may be formed on the NFET area of the substrate. As indicated at block 1715, patterning may be carried out using a SIT technique, and spacers may be formed on the mandrels and the fins. As indicated at block 1720, dummy gates are formed in both the NFET area and the PFET area. In block 1725, extensions may be formed in the PFET area at source/drain regions using epitaxial growth, with the optional thermal cycle for diffusion. A MOL dielectric layer (e.g., ILD) may be formed on the NFET area and the PFET area and planarized, as indicated at block 1730. As indicated at block 1735, the dummy gates in the PFET area may be removed and replaced with RMGs. A reliability anneal may be performed, if desired. As indicated at block 1740, the ILD may be recessed and/or removed in the NFET area in the source/drain regions. Block 1750 illustrates that undoped sidewalls of III-V material may be epitaxially grown on the mandrels in the NFET area to form channels. As indicated at block 1755, the portions of the mandrels outside the dummy gate area may be removed. As indicated at block 1760, n+ III-V material is epitaxially grown in the source/drain regions in the NFET area. Block 1765 indicates that an ILD layer may be re-deposited in the NFET area and planarized. As indicated at block 1770, the dummy gates in the NFET area may be removed. As indicated at block 1775, the portions of the mandrels inside the previously removed dummy gates may also be removed. As indicated at block 1780, the removed dummy gates may be replaced with RMGs. Other MOL or back-end-of-line (BEOL) processing may be continued, as indicated at block 1785.

The various blocks shown in FIG. 17 may be viewed as method steps, and/or as operations that result from operation of computer program code, and/or as a plurality of coupled logic circuit elements constructed to carry out the associated function(s).

In accordance with one aspect of an exemplary embodiment, a method comprises forming first structures on a first portion of a silicon substrate and second structures on a second portion of the silicon substrate; forming spacers on the first structures; forming dummy gates on the first structures and on the second structures; depositing a first interlayer dielectric on the formed dummy gates in the first portion and the second portion; removing the dummy gates from the second structures; forming one or more second metal gates on the second structures; performing an anneal on the silicon substrate, the first structures, and the second structures; forming recess areas in the first interlayer dielectric to expose the first structures; removing the spacers from the first structures; epitaxially growing sidewalls on the first structures; removing portions of the first structures outside the dummy gates from the first portion; depositing a second interlayer dielectric on the first portion; removing the dummy gates from the first portion; removing portions of the first structures previously under the dummy gates from the first portion; and forming one or more first metal gates on the first structures.

The first portion of the silicon substrate may comprise silicon-on-insulator and the second portion of the silicon substrate may comprise silicon-on-insulator or SiGe. Performing an anneal on the silicon substrate, the first structures, and the second structures may comprise performing a high-k reliability anneal. Epitaxially growing sidewalls on the first structures may comprise epitaxially growing a III-V material on the first structures after the anneal. Epitaxially growing sidewalls on the first structures may comprise epitaxially growing InGaAs on the first structures after the anneal.

In accordance with another aspect of an exemplary embodiment, a method comprises providing a silicon substrate, a buried oxide layer on the silicon substrate, an NFET layer of silicon-on-insulator on an NFET portion of the buried oxide layer, and a PFET layer of silicon-on-insulator or SiGe on a PFET portion of the buried oxide layer; forming mandrels in the silicon-on-insulator of the NFET layer; forming fins in the silicon-on-insulator or SiGe of the PFET layer; forming first spacers on the mandrels; forming dummy gates on the mandrels and on the fins; depositing a first interlayer dielectric on the formed dummy gates in the NFET portion and the PFET portion; removing the dummy gates from the fins; forming one or more metal gates on the fins; performing an anneal on the silicon substrate, the mandrels, and the fins; forming recess areas in the first interlayer dielectric to expose the mandrels; removing the first spacers; epitaxially growing sidewalls on the mandrels; removing portions of the mandrels outside the dummy gates from the NFET portion; depositing a second interlayer dielectric on the NFET portion; removing the dummy gates from the NFET portion; removing remaining portions of the mandrels from the NFET portion to leave the sidewalls grown on the mandrels; and forming one or more metal gates on the sidewalls grown on the removed mandrels.

The method may further comprise patterning the NFET portion using an oxide hardmask prior to forming the mandrels in the silicon-on-insulator of the NFET layer. The method may further comprise patterning the PFET portion using a sidewall image transfer technique prior to forming the fins in the silicon-on-insulator or SiGe of the PFET layer. Forming the first spacers on the mandrels may comprise depositing a conformal nitride or, an oxide on the mandrels using a sidewall image transfer technique. The conformal nitride or oxide on the mandrels may be etched to form a structure defining the spacer using reactive ion etching. The method may further comprise planarizing after depositing the first interlayer dielectric. Forming the recess areas in the first interlayer dielectric to expose the mandrels may comprise using a dry etch process, a wet etch process, or a combination of dry etch and wet etch processes. Epitaxially growing the sidewalls on the mandrels may comprise seeding the mandrels with a III-V material and maintaining a preselected temperature and pressure to initiate a growth of the III-V material. Removing the portions of the mandrels outside the dummy gates from the NFET portion may comprise exposing at least an upper portion of the buried oxide layer on the NFET portion. The method may further comprise forming second spacers transverse to the sidewalls after removing the portions of the mandrels from outside the dummy gates on the NFET portion. The method may further comprise epitaxially growing source/drains in the PFET layer after forming dummy gates on the mandrels and on the fins and epitaxially growing source/drains in the NFET layer after removing the portions of the mandrels from outside the, dummy gates on the NFET portion.

In accordance with another aspect of an exemplary embodiment, a structure comprises a substrate having a handle layer of silicon, a buried oxide layer on the handle layer, an NFET layer of silicon-on-insulator on an NFET portion of the buried oxide layer, and a PFET layer of silicon-on-insulator or SiGe on a PFET portion of the buried oxide layer; fins in the silicon-on-insulator or SiGe of the PFET layer; source/drains in the PFET layer; one or more first metal gates on the fins; channel structures of III-V material in the silicon-on-insulator in the NFET portion; source/drains in the NFET portion; and one or more second metal gates on the channel structures in the NFET layer.

The structure may further comprise a high-k dielectric layer on the channel structures in the NFET layer. The one or more second metal gates may be capped.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. A structure, comprising:
   a substrate having a handle layer of silicon, a buried oxide layer on the handle layer, an NFET layer of silicon-on-insulator on an NFET portion of the buried oxide layer, and a PFET layer of silicon-on-insulator or SiGe on a PFET portion of the buried oxide layer;
   fins in the silicon-on-insulator or SiGe of the PFET layer;
   source/drains in the PFET layer;
   one or more first metal gates on the fins, wherein the fins, the source/drains in the PFET layer, and the one or more first metal gates on the fins are annealed;
   channel structures of III-V material in the silicon-on-insulator in the NFET portion, wherein the channel structures are not annealed;
   source/drains in the NFET portion; and
   one or more second metal gates on the channel structures in the NFET layer.

2. The structure of claim 1, further comprising a high-k dielectric layer on the channel structures in the NFET layer.

3. The structure of claim 1, wherein the one or more second metal gates are capped.

4. The structure of claim 3, wherein the one or more second metal gates are capped with a nitride.

5. The structure of claim 1, wherein the channel structures of III-V material are formed from a first III-V material and wherein the source/drains in the NFET portion include a second III-V material that is different from the first III-V material.

6. The structure of claim 5, wherein the first III-V material and the second III-V material are each selected from the group consisting of gallium arsenide (GaAs), aluminum arsenide (AlAs), gallium phosphide (GaP), gallium nitride (GaN), gallium arsenide phosphide (GaAsP), gallium indium arsenide antimony phosphide (GaInAsSbP), aluminum gallium arsenide (AlGaAs), aluminum gallium indium arsenide (AlGaInAs), indium arsenide (InAs), indium gallium phosphide (InGaP), indium gallium arsenide (InGaAs), indium arsenide antimony phosphide (InAsSbP), indium gallium aluminum phosphide (InGaAlP), and combinations of the foregoing.

7. A structure, comprising:
   a substrate having a handle layer of silicon, a buried oxide layer on the handle layer, an NFET layer of silicon-on-insulator on an NFET portion of the buried oxide layer, and a PFET layer of silicon-on-insulator or SiGe on a PFET portion of the buried oxide layer;
   fins in the silicon-on-insulator or SiGe of the PFET layer;
   source/drains in the PFET layer;
   one or more first metal gates on the fins;
   channel structures formed in the silicon-on-insulator in the NFET portion;
   source/drains in the NFET portion; and
   one or more second metal gates on the channel structures in the NFET layer;
   wherein the channel structures formed in the silicon-on-insulator in the NFET portion are formed from a first III-V material and wherein the source/drains in the NFET portion include a second III-V material that is different from the first III-V material.

8. The structure of claim 7, wherein the first III-V material and the second III-V material are selected from the group consisting of gallium arsenide (GaAs), aluminum arsenide (AlAs), gallium phosphide (Gap), gallium nitride (GaN), gallium arsenide phosphide (GaAsP), gallium indium arsenide antimony phosphide (GaInAsSbP), aluminum gallium arsenide (AlGaAs), aluminum gallium indium arsenide (AlGaInAs), indium arsenide (InAs), indium gallium phosphide (InGaP), indium gallium arsenide (InGaAs), indium arsenide antimony phosphide (InAsSbP), indium gallium aluminum phosphide (InGaAlP), and combinations of the foregoing.

9. The structure of claim 7, wherein the first III-V material is selected from the group consisting of InGaAs and GaAs, and wherein the second III-V material is selected from the group consisting of InGaAs and InAs.

\* \* \* \* \*